(12) United States Patent
O'Keeffe

(10) Patent No.: US 10,755,871 B2
(45) Date of Patent: *Aug. 25, 2020

(54) SMART SPEAKER WITH INTERACTIVE SPEAKER GRILLE

(71) Applicant: James Thomas O'Keeffe, Mountain View, CA (US)

(72) Inventor: James Thomas O'Keeffe, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/147,320

(22) Filed: Sep. 28, 2018

(65) Prior Publication Data

US 2019/0035567 A1    Jan. 31, 2019

Related U.S. Application Data

(63) Continuation-in-part of application No. 15/796,977, filed on Oct. 30, 2017, now Pat. No. 10,090,119, which is a continuation-in-part of application No. 15/193,012, filed on Jun. 25, 2016, now Pat. No. 9,807,481, which is a continuation-in-part of
(Continued)

(51) Int. Cl.
| | |
|---|---|
| *H01H 9/02* | (2006.01) |
| *H04R 1/02* | (2006.01) |
| *H04R 27/00* | (2006.01) |
| *H04W 4/02* | (2018.01) |
| *H04W 4/21* | (2018.01) |

(Continued)

(52) U.S. Cl.
CPC ............ *H01H 9/0271* (2013.01); *H01H 9/02* (2013.01); *H04R 1/023* (2013.01); *H04R 1/028* (2013.01); *H04R 3/00* (2013.01); *H04W 4/023* (2013.01); *H04W 4/21* (2018.02); *H01H 2239/048* (2013.01); *H03K 17/96* (2013.01); *H03K 2017/9602* (2013.01); *H04R 27/00* (2013.01); *H04R 2227/003* (2013.01); *H04R 2227/005* (2013.01); *H04R 2420/07* (2013.01); *H04R 2430/01* (2013.01)

(58) Field of Classification Search
CPC .. H01H 9/0271; H01H 2239/048; H01H 9/02; H04R 1/028; H04R 1/025; H04R 1/023; H04R 27/00; H04R 2420/07; H04R 29/001; H04R 2201/028; H04W 4/023; H04W 4/206; H04W 4/005; H04W 4/21; H04W 4/80; G06F 3/162
USPC ..................................... 381/117, 82, 85, 391
See application file for complete search history.

(56) References Cited

U.S. PATENT DOCUMENTS

| | | |
|---|---|---|
| 3,306,990 A | 2/1967 | Walker |
| 3,927,402 A | 12/1975 | Thompson |
| (Continued) | | |

*Primary Examiner* — Vivian C Chin
*Assistant Examiner* — Douglas J Suthers

(57) ABSTRACT

A smart speaker is disclosed with an interactive speaker grille. In one embodiment a smart speaker comprises a housing with a speaker grille comprising a plurality of openings. Circuitry coupled to the speaker grille is configured to sense direct user interaction with one or more of a plurality of regions of the speaker grille and to generate corresponding electrical signals indicative of the one or more regions of the speaker grille experiencing direct user interaction. The circuitry can include portions in the path of sound transmission to detect user interaction with regions of the grille and portions outside the path of sound transmission for controlling aspects of the smart speaker (e.g. speaker volume, radio station or media stream selection) based on the particular regions touched.

27 Claims, 28 Drawing Sheets

Related U.S. Application Data application No. 14/918,586, filed on Oct. 21, 2015, now Pat. No. 9,406,456, which is a continuation of application No. 14/788,726, filed on Jun. 30, 2015, now Pat. No. 9,196,432.

(60) Provisional application No. 62/572,575, filed on Oct. 16, 2017, provisional application No. 62/054,389, filed on Sep. 24, 2014.

(51) Int. Cl.
*H04R 3/00* (2006.01)
*H03K 17/96* (2006.01)

(56) References Cited

U.S. PATENT DOCUMENTS

| | | |
|---|---|---|
| 4,012,602 A | 3/1977 | Jackson |
| 4,719,322 A | 1/1988 | Guzik et al. |
| 5,721,787 A | 2/1998 | Neibaur et al. |
| 5,914,826 A | 6/1999 | Smallwood |
| 6,091,037 A | 7/2000 | Bachschmid |
| 7,299,892 B2 | 11/2007 | Radu |
| 7,608,948 B2 | 10/2009 | Nearhoof |
| 8,666,104 B2 | 3/2014 | Ivey |
| 8,675,887 B2 | 3/2014 | Yuan |
| 9,196,432 B1 | 11/2015 | O'Keeffe |
| 9,406,456 B2 | 8/2016 | O'Keeffe |
| 9,807,481 B2 | 10/2017 | O'Keeffe |
| 2005/0237218 A1 | 10/2005 | Tang |
| 2006/0161270 A1 | 7/2006 | Luskin |
| 2007/0289860 A1 | 12/2007 | Newman |
| 2011/0181201 A1 | 7/2011 | Hollis |
| 2014/0270237 A1 | 9/2014 | Wang |
| 2014/0270264 A1 | 9/2014 | Wang |
| 2018/0108497 A1 | 4/2018 | O'Keeffe |

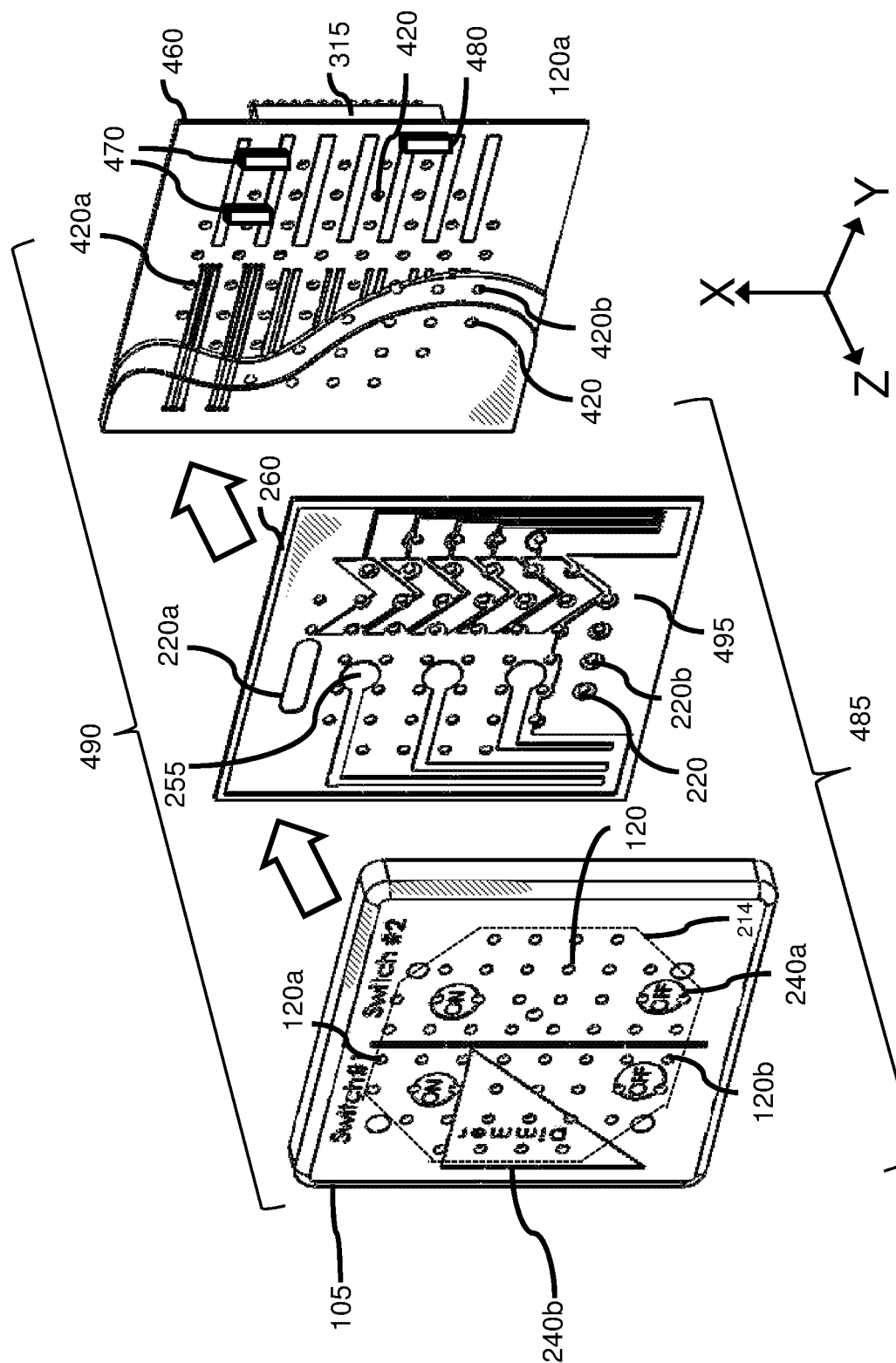

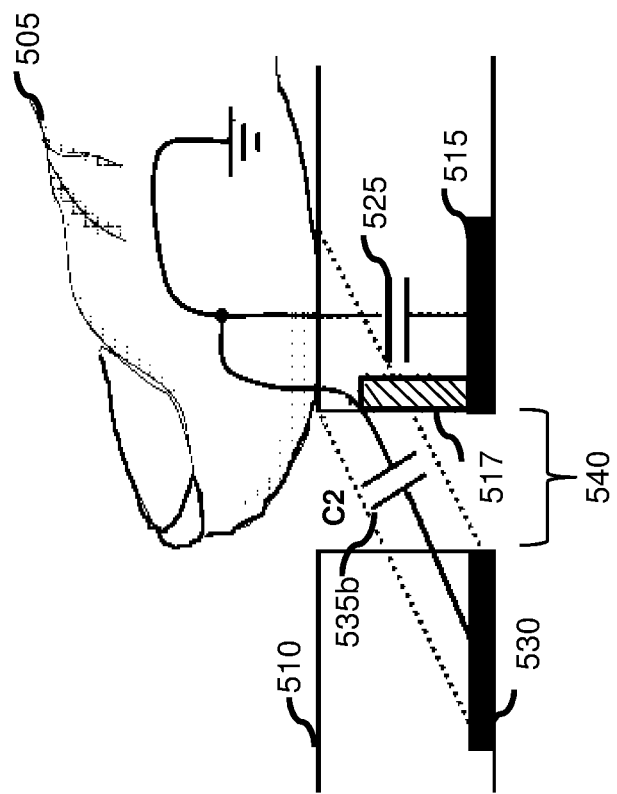

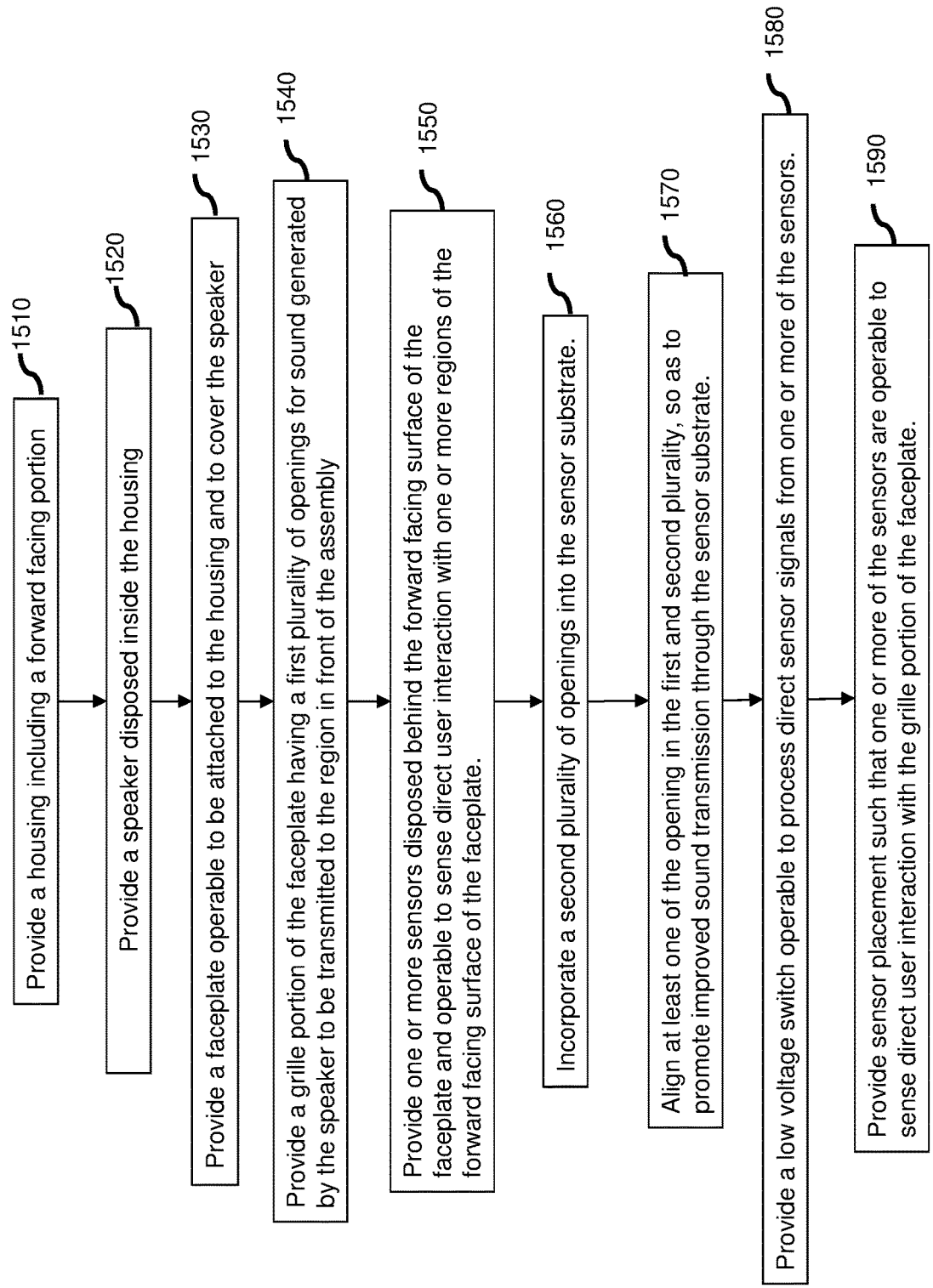

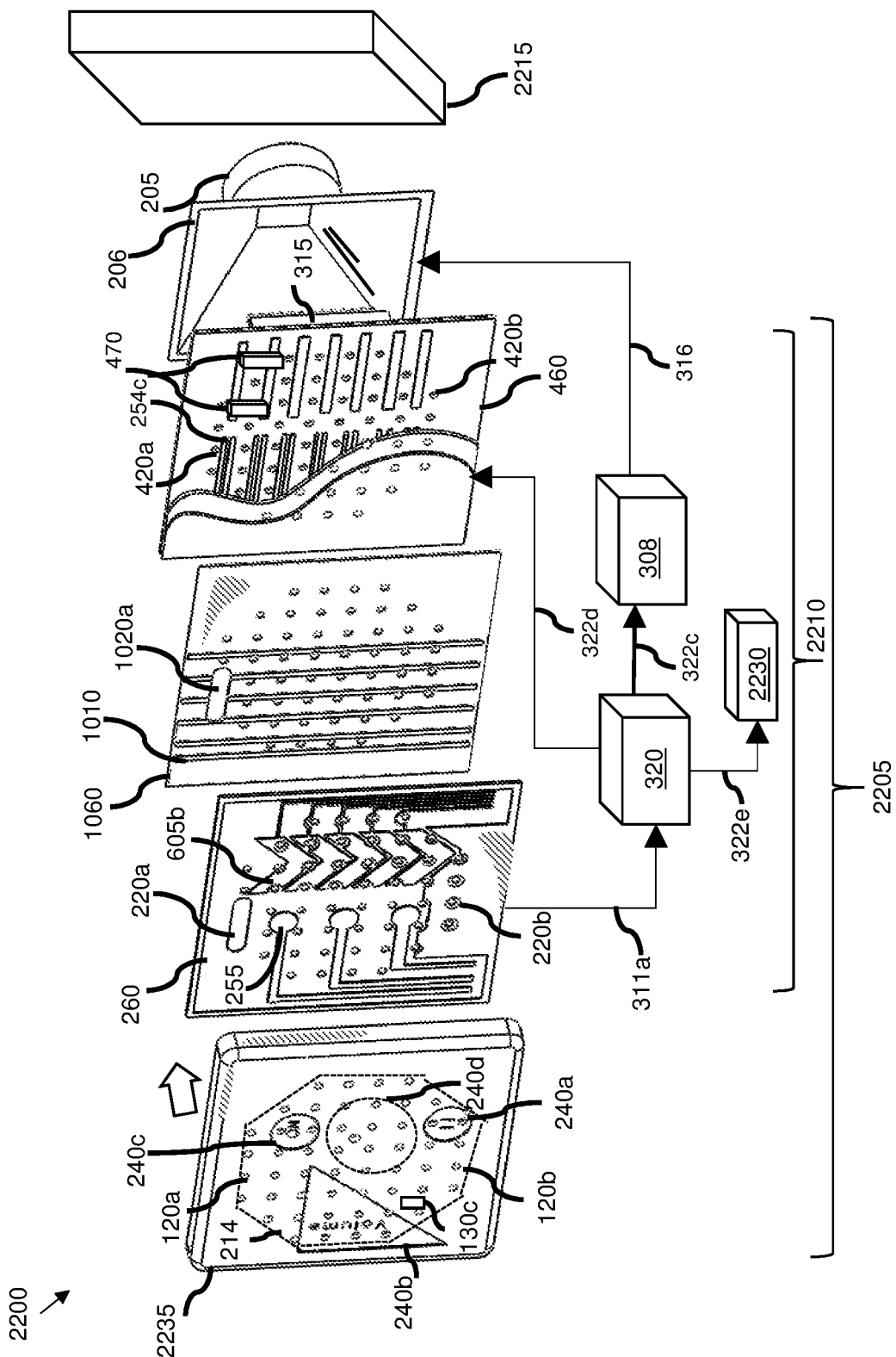

SMART SPEAKER WITH INTERACTIVE SPEAKER GRILLE

CROSS REFERENCE TO RELATED APPLICATIONS

This application claims the benefit of U.S. Provisional Patent Application No. 62/572,575, filed Oct. 16, 2017.

This application is also a continuation in part of U.S. patent application Ser. No. 15/796,977, filed Oct. 30, 2017, titled "SMART SPEAKER WITH MULTIFUNCTIONAL FACEPLATE AND DISPLAY," now U.S. Pat. No. 10,090,119, which is a continuation in part of U.S. patent application Ser. No. 15/193,012, filed Jun. 25, 2016, titled "SMART SPEAKER WITH MULTIFUNCTIONAL FACEPLATE AND LOCAL ENVIRONMENTAL SENSING," now U.S. Pat. No. 9,807,481, which is a continuation in part of U.S. patent application Ser. No. 14/918,586, filed Oct. 21, 2015, titled "SMART ELECTRICAL SWITCH WITH AUDIO CAPABILITY," now U.S. Pat. No. 9,406,456, which is a continuation of U.S. patent application Ser. No. 14/788,726, filed Jun. 30, 2015, titled "SMART ELECTRICAL SWITCH WITH AUDIO CAPABILITY," now U.S. Pat. No. 9,196,432, which claims the benefit of U.S. Provisional Patent Application No. 62/054,389, filed Sep. 24, 2014, titled "SYSTEMS AND METHODS FOR OPERATING A DYNAMIC SUBSET OF HOME AUTOMATION DEVICES."

INCORPORATION BY REFERENCE

All publications and patent applications mentioned in this specification are herein incorporated by reference to the same extent as if each individual publication or patent application was specifically and individually indicated to be incorporated by reference.

FIELD

The present disclosure relates generally to user control of a sound generating system.

BACKGROUND

The proliferation of smartphones has led to consumers increasingly carrying music collections with them. Speaker manufacturers have responded to this market trend by making smaller, portable wireless speakers and wireless multi-room speakers (e.g., Bluetooth portable speakers and multi-room Wi-Fi speakers). As the form factor of wireless speakers shrinks, the proportion of the enclosure occupied by the speaker element (e.g. the speaker cone and electromagnetic driver) has increased.

In a related area, a new generation of smart speakers (e.g. the Amazon Echo, the Google Home speaker and the Apple HomePod) combine music streaming with an interface to the World Wide Web and provide user control of smart building automation devices (e.g. smart lighting and smart televisions). User interfaces to smart speakers are an active area of innovation, due in part to the competing requirements for user controls (e.g. buttons and sensors) and large speaker elements in small enclosures.

SUMMARY OF THE DISCLOSURE

In one example, a sound generating system is provided, comprising a speaker, a housing and a speaker grille. The speaker grille comprises a plurality of openings operable to transmit sound from the speaker. The sound generating system further comprises circuitry coupled to the speaker grille. The speaker grille further comprises a plurality of regions each comprising at least some of the plurality of openings. In response to direct user interaction with a region from the plurality of regions of the speaker grille, the circuitry is configured to generate a corresponding electrical signals, indicative of the region of the speaker grille experiencing direct user interaction. In this way direct user interaction with different regions on the speaker grille can be distinguished, thereby enabling a wide variety of distinct user controls to be disposed on distinct regions of the speaker grille (e.g. increase volume, decrease volume, PAUSE or PLAY).

In another embodiment, a smart speaker has an environmental sensing faceplate subassembly located in the path of sound transmission from a speaker component, the subassembly being operable to provide both sound transmission and sensing of the local environment. In another embodiments an environmental sensing faceplate subassembly comprises: a front surface with a grille, a circuit board places in the path of sound transmission from a speaker and an indirect input sensor, wherein the circuit board comprises means that enable the indirect input sensor to sense an aspect of the local environment (e.g. the room where the smart speaker resides) and wherein the circuit board has openings that align with the grille to promote improved sound transmission from the speaker.

In particular embodiments, a smart speaker includes a speaker, a housing with a speaker grille portion, a circuit board, and one or more indirect input sensors (e.g. an antenna or a proximity sensor). The grille can comprise a first plurality of openings. The circuit board can reside behind the grille and in front of the speaker (e.g. in the path of sound transmission from the speaker). The circuit board can be a substrate for the one or more indirect input sensors. The circuit board can further comprise a second plurality of openings, at least some of which align with at least some of the openings in the grille, thereby providing sound transmission through the circuit board, while providing improved access for the sensors to the local environment in the vicinity of the smart speaker. Several embodiments enable the region behind the speaker grille to accomplish the dual functions sensing the local environment and sound transmission. For example, an indirect input sensor may detect aspects of the local environment (e.g. hand gestures made by a user, or the location of a person) and activate one more aspects of the smart speaker in response (e.g. illuminate a display). In some embodiments the disclosed invention enables the system to detect when a person is proximal to the smart speaker and activate an aspect of the smart speaker.

The techniques described in this specification can be implemented to achieve the following exemplary advantages: The field of view of indirect input sensors can be improved by enabling them to be placed in close proximity to the speaker grille and in some cases in the path of sound transmission from the speaker to the grille. In a related advantage the indirect input sensors can benefit from direct line of site to the local environment in front of the speaker grille through the openings in the grille. In another advantage placement of the indirect input sensors forward of the speaker cone can provide a location with lower electromagnetic interference. In yet another advantage the plurality of openings in the circuit board(s) can act to improve the sensing by conditioning sensor signals from the local environment (e.g. collimating light to a narrow range of angles as it passes through the openings, attenuating particular sound or RF frequencies, forming via holes between two or more layers in circuit board, or forming part of an antenna).

BRIEF DESCRIPTION OF THE DRAWINGS

FIGS. 4A and 4B illustrates an exemplary front view of a faceplate with a touch sensitive speaker grille and two circuit boards in accordance with one embodiment of the present technology.

FIGS. 5A to 5C. illustrates a finger interacting with a target sensor electrode and a neighboring sensor electrode in accordance with one embodiment of the present technology

FIG. 15 is a flow chart diagram that outlines the operations associated with integrating an electrical switch assembly with audio capability, including a touch sensitive speaker grille.

FIG. 22 illustrates is a disassembled view of a sound generating system with an interactive speaker grille in accordance with an embodiment of the present invention

DETAILED DESCRIPTION

FIGS. 1-11

In the following detailed description, for purposes of explanation, numerous specific details are set forth to provide a thorough understanding of the various implementations of the present invention. Those of ordinary skill in the art will realize that these various implementations of the present invention are illustrative only and are not intended to be limiting in any way. Other implementations of the present invention will readily suggest themselves to such skilled persons having the benefit of this disclosure.

In addition, for clarity purposes, not all of the routine features of the implementations described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

It is to be appreciated that while one or more implementations are described further herein in the context of a typical building based electrical switch assembly used in a residential home, such as single-family residential home, the scope of the present teachings is not so limited. More generally, electrical switches with audio capability according to one or more of the preferred implementations are applicable for a wide variety of buildings having one or more speakers including, without limitation, duplexes, townhomes, multi-unit apartment buildings, hotels, retail stores, office buildings and industrial buildings. Further it is to be appreciated that an electrical switch with audio capability according to the implementations disclosed could be implemented in ships and airplanes. Further, it is to be appreciated that while the terms user, customer, installer, homeowner, occupant, guest, tenant, landlord, repair person, and the like may be used to refer to the person or persons who are interacting with the speaker or other device or user interface in the context of one or more scenarios described herein, these references are by no means to be considered as limiting the scope of the present teachings with respect to the person or persons who are performing such actions.

Figure 1:
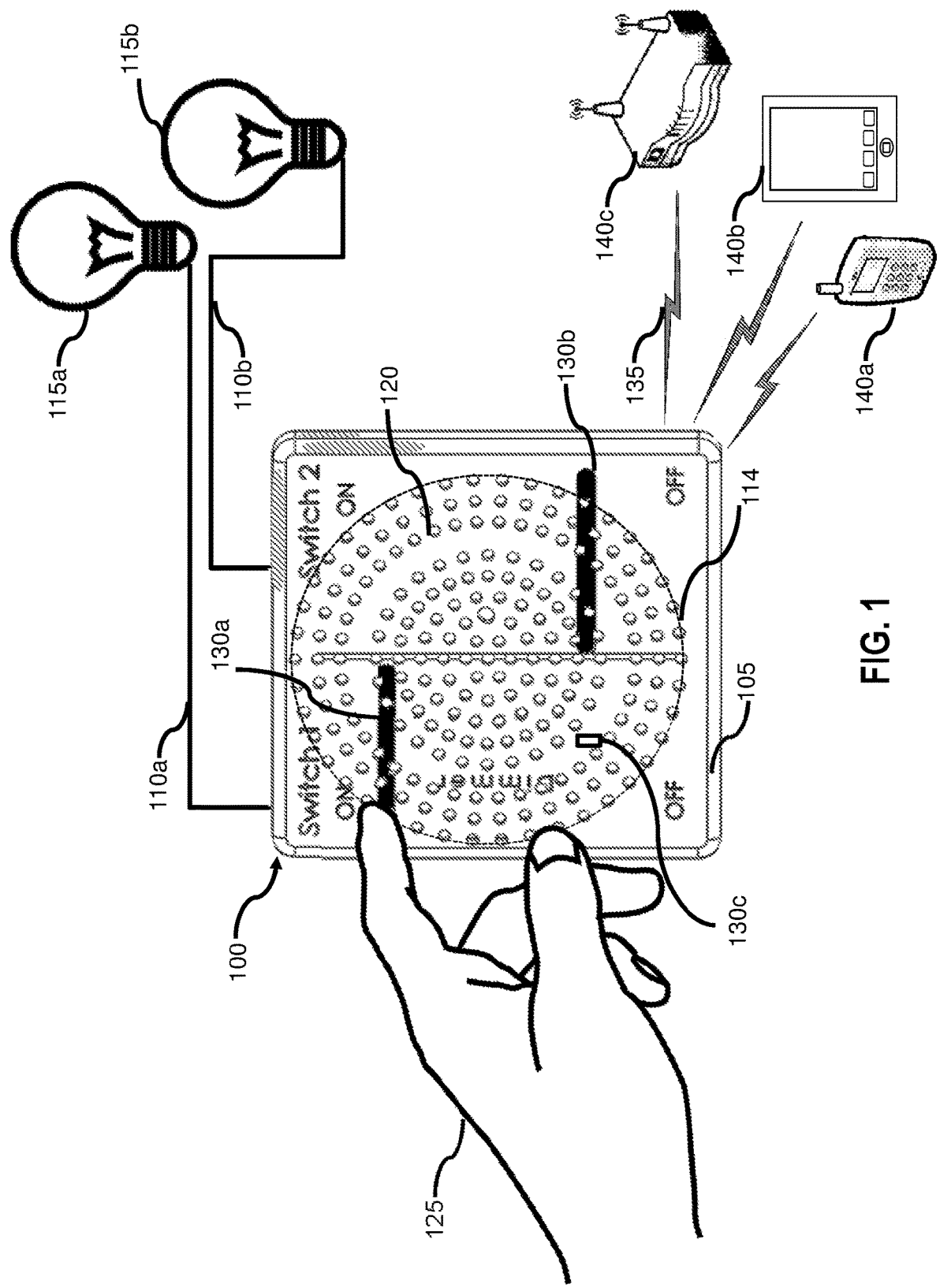
FIG. 1 is an exemplary diagram of the front faceplate of an electrical switch assembly with audio capability and means for a user to operate two switches in accordance with an aspect of the present disclosure.

FIG. 1 is a diagram illustrating the front view of an exemplary wall-mounted electrical switch assembly 100 in accordance with an embodiment of the present disclosure. The electrical switch assembly 100 is designed to reside in an electrical junction box (not shown in FIG. 1). FIG. 1 illustrates a 2-bay switch assembly. A touch sensitive faceplate 105 controls power to two wires 110a and 110b and thereby controls the operation of two lights 115a and 115b. Alternative implementations of this disclosure can include other sizes of electrical switch assembly optimized for different sizes of electrical junction box designed to serve different numbers of building-based electrical devices (e.g. Lights, switch operated electrical outlets or garbage disposals). For example, a single bay junction box is common in many bedrooms to accommodate a single light switch, while other locations may have three or four bay junction boxes. Faceplate 105 contains a plurality of openings 120 that form a speaker grille 114. A substantial portion of the faceplate 105 can be occupied by speaker grille 114 (e.g. 50-100% of the total area of the front surface of faceplate 105). Grille 114 protects a speaker (not shown in FIG. 1) located behind the faceplate while enabling effective sound transmission through the openings 120. The faceplate, and in particular speaker grille 114, is touch-sensitive, thereby enabling a person 125 to touch portions of the speaker grille 114 to operate lights 115a and 115b. Speaker grille 114 combines a variety of functions including sound transmission, light switch control, speaker protection and user protection. Aspects of the present disclosure show how to implement touch sensor functionality, while providing sound transmission through a large number of openings in the grille 114. The touch sensitive speaker grille 114 and faceplate 105 can register binary user commands (e.g. ON/OFF) as well as continuum user input commands (e.g. increase illumination with a dimmer). Elements 130a, 130b and 130c are regions of the faceplate that illuminate in order to further facilitate a user 125 with visual feedback. For example elements 130a and 130b can show the present state of the electrical switches number 1 and number 2 (e.g. ON/OFF/dimmed). In one implementation elements 130a and 130b are two elongated lines of light indicating the position of two dimmer switches. The user 125 can touch the faceplate 105 and drag the illuminated indication regions 130a and 130b up or down to a desired location and controlling lights 115 in the process. Faceplate 105 designed in accordance with the present disclosure provides means for visual switch position indication and touch sensitive surfaces while facilitating sound transmission with a large speaker grille portion 114. In some implementations the touch sensitive speaker grille 114 can provide improved access for sensors positioned behind the faceplate (e.g. passive Infrared, active infrared proximity sensors or temperature sensors) to measure the environment in the region in front of the faceplate 105. In some implementations sensors located behind the touch-sensitive speaker grille can provide enhanced sensing of a person in the vicinity of the switch assembly and illuminate regions 130a, 130b and 130c when a person is nearby. In the implementation illustrated in FIG. 1 electrical switch assembly 100, receives wireless signals 135 and can play music or audio messages from a variety of wireless devices 140, for example a smartphone 140a, a tablet PC 140b or a media server 140c. The media server 140c can be an internet gateway (e.g. a home broadband internet router) and transmit internet radio content to electrical switch assembly 100.

Figure 2A:
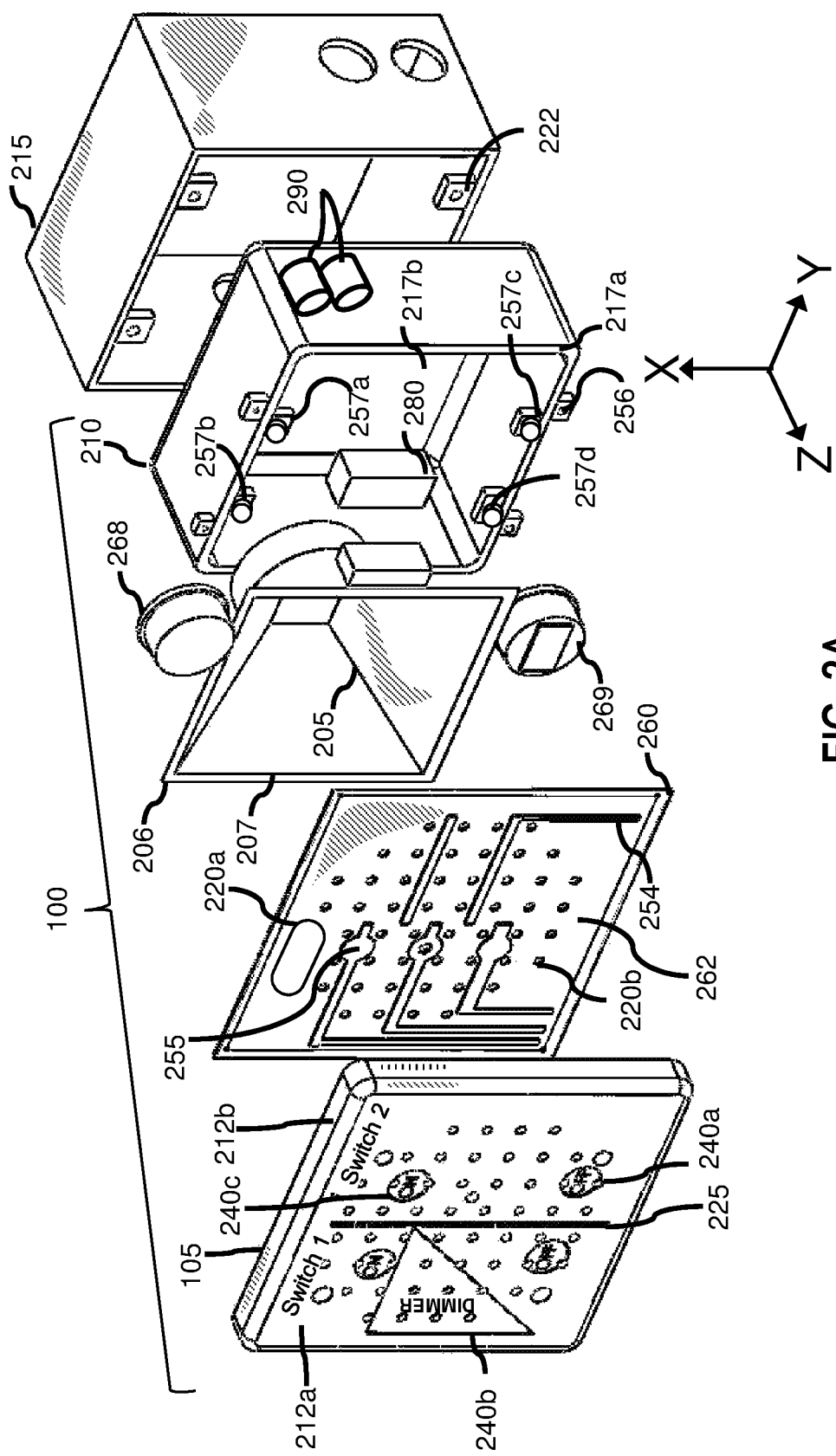
FIGS. 2A and 2B is a disassembled view of an electrical switch assembly with audio capability, including a speaker, and a touch sensitive faceplate in accordance with an embodiment of the present invention.
Figure 2B:
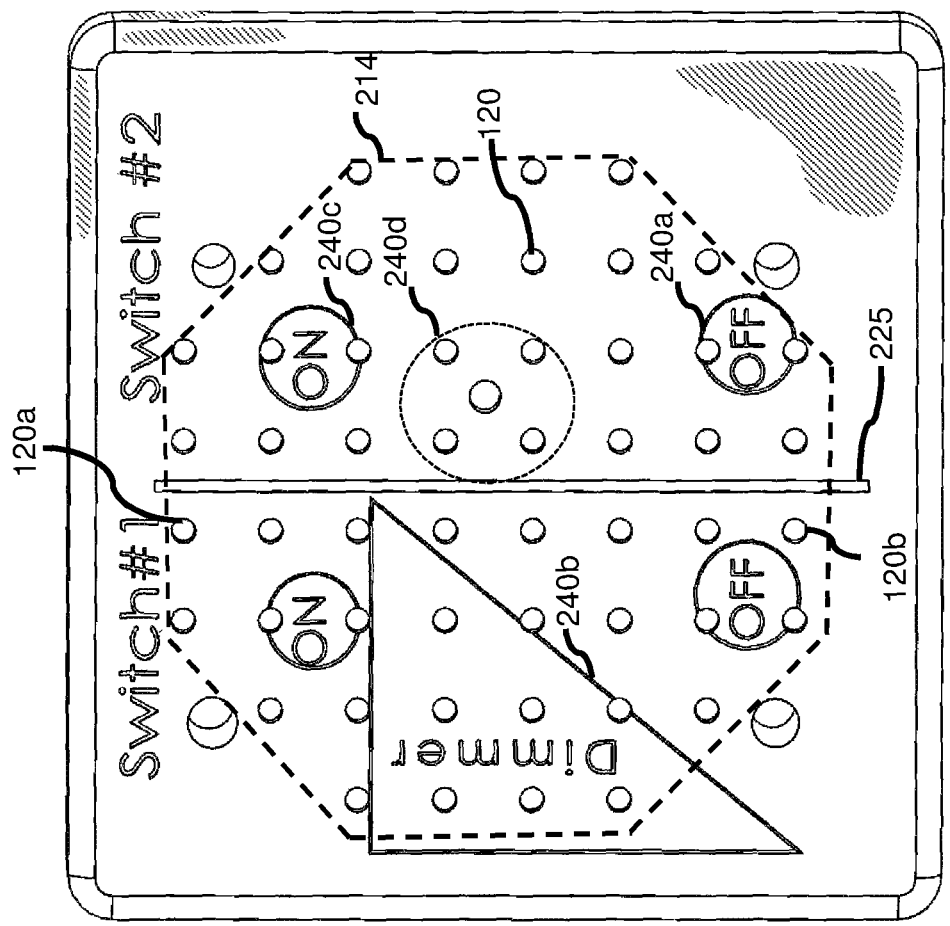

FIGS. 2A and 2B are disassembled views of an electrical switch assembly including a speaker grille 214 that can sense direct user interaction (e.g. touch or pressure) in accordance with one implementation of the present disclosure. Switch assembly 100 contains a housing 210. Housing 210 is a mechanical enclosure for components of electrical switch assembly 100. In one implementation housing 210 provides electrical and mechanical separation for components in electrical switch assembly 100 from the contents (e.g. wires) in an electrical junction box 215. Housing 210 can contain two or more electrical terminals 290 operable to be attached to building-based wiring. Building based wiring can include wiring within the walls of a building or carried in metallic or plastic tubing for the purpose of electrically connecting switches and service points in the building. Service points can include wall mounted electrical sockets, HVAC equipment, sprinkler components and lighting fixtures in ceilings and walls. Examples of terminals 290 include screw terminal (e.g. those found on many light switches) and wire pigtails (e.g. a length of wire protruding from the housing). Housing 210 may be sized to fit in an electrical junction box 215 of a particular size. For example the two-bay junction box illustrated in FIG. 1 is approximately 4 inches wide and can accommodate two standard electrical light switches. The exemplary housing 210 in FIG. 1 is approximately 4 inches wide and 4 inches high and is designed to fit inside the majority of two-bay electrical junction boxes. Housing 210 has forward facing surfaces 217a and 217b.

Housing 210 contains a speaker 205 operable to generate sound in the region of the assembly. Speaker 205 functions to emit sound through the grille portion 214 of faceplate 105. Grille 214 and grille 114 are operable similar exemplary grilles with different shapes. Speaker 205 can be an electromagnetic type speaker with an external or internal electromagnet. In FIG. 2A speaker 205 is located centrally in housing 210 and can occupy the position traditionally occupied by one or more mechanical switches. In another aspect of several embodiments the speaker grille is designed to fulfill the function of the electrical switches, including dimmer switches, that would traditionally occupy the space where speaker 205 is placed. Speaker 205 can have mounting features securing it to the housing 210 and in some embodiments an air-tight seal is be formed between speaker 205 and housing 210 that enables further audio quality enhancement. Speaker 205 can have a mounting flange 206 operable to secure the speaker to housing 210. Mounting flange 206 can have a variety of shapes including square or circular. Speaker 205 has a speaker cone 207 operable to move in the positive and negative Z direction when the electromagnet in the speaker is energized. The cone has a forward facing surface operable to project sound in the Z direction. In one embodiment the electrical switch assembly is designed to fit inside a 1-bay electrical junction box with dimensions of approximately 2 inches in the Y direction of FIG. 2A and 4 inches in the direction of X in FIG. 2B. In this embodiment the assembly 100 could contain a 3 W 4 ohm speaker with a speaker cone with a diameter of approximately 50 mm. In another embodiment the electrical switch assembly 100 is designed to fit inside a 2-bay electrical junction box with dimensions of approximately 4 inches in the Y direction of FIG. 2A and 4 inches in the positive X direction in FIG. 2B. In this embodiment assembly 100 can contain a larger speaker with a cone of diameter 76 mm. Speaker 205 could be model number 1-530-767-12 from Sony. Speaker 205 can have a similar design to the speaker component used in a portable Bluetooth or Wi-Fi enabled wireless speaker, for example Jawbone Jambox®. In some embodiments electrical switch assembly 100 can include two or more speakers. This is sometimes advantageous when more sound volume is required than can be provided by a single speaker.

Figure 11:
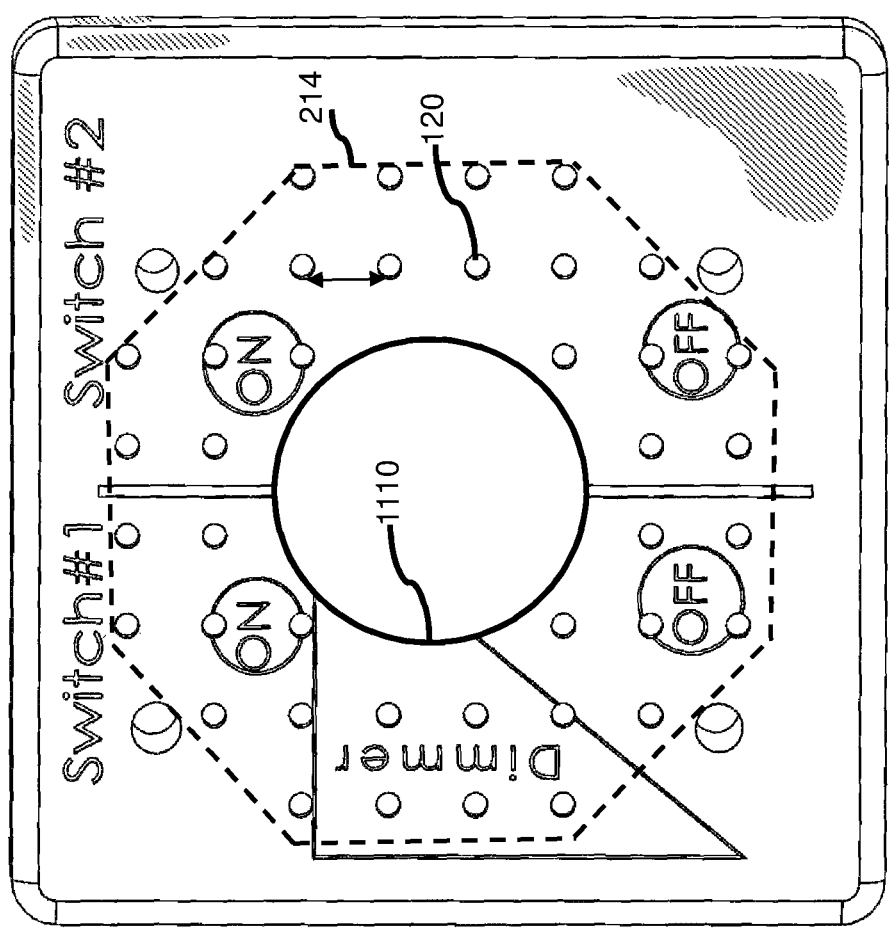
FIG. 11 illustrates exemplary front views of a faceplate with a speaker grille and solid center section in accordance with one embodiment of the present technology.

Electrical switch assembly 100 can contain a faceplate 105 with a front surface including portions 212a and 212b. The front surface can include a large portion 212a in the X-Y plane and can also include the edges of the faceplate 212b. The front surface including portions 212a and 212b provide surface for the user to interact while at the same time faceplate 105 provides electrical isolation, between the user and high voltage components in the switch assembly behind the faceplate. Faceplate 105 can be constructed from a variety of materials including plastics, glass or enamel covered metal or metal. Faceplate 105 can be flat with rounded edges as illustrated in FIG. 2A and FIG. 2B. In other embodiments faceplate 105 can have a curved structure that can provide increased mechanical stiffness, when the front of the faceplate is touched or pressed. Faceplate 105 can contain one or more ribs molded on the interior surfaces to further increase mechanical stiffness. Faceplate 105 can function to conceal the gaps between the enclosure 210 and the electrical junction box 215. The faceplate provides an aesthetically pleasing front surface for the user to interact with while concealing gaps between paint or drywall interfaces and junction box 215. FIG. 2B illustrates that faceplate 105 contains a plurality of openings 120 that form a speaker grille portion 214 of the faceplate. Openings 120 can have a variety of shapes including circular, diamond, or oval. Speaker grille 214 is designed to transmit sound into the air space in front of the faceplate in a manner so as to provide effective sound to a user in the vicinity of the electrical switch assembly. FIG. 11 illustrates that speaker grille can be disposed as a complex shape comprising a plurality of openings 120 surround one or more solid sections 1110. A solid section 1110 could be a decorative surface for a manufacturer to place a logo, hold a button, hold a touch sensitive button or an illuminated element. In the context of this disclosure a speaker grille refers to a portion of the faceplate 105 comprising a plurality of openings operable to transmit sound from a speaker and would not include the solid section 1110 illustrated in FIG. 11. In some embodiment the grille comprises several small clusters of openings. In this case the grille can refer to the combined portions of the faceplate covered by the openings. In the absence of molded features, edges or material differences delineating the boundary of the speaker grille 214 portion of faceplate 105, the grille portion can considered to be bounded by straight lines joining the points on the perimeter of those openings that form the perimeter of a plurality of openings. Faceplate 105 contains one or more regions 240 wherein direct user input (e.g., touching, swiping or pressing) is operable to be sensed by one or more sensor electrodes 255. For example regions 240a, 240b and 240c in FIG. 2A are exemplary touch sensitive regions used to control the operation of two electrical switches. In one implementation user input region 240a functions as a binary switch to turn off switch number 2. While the exact mechanism for turning off switch number 2 in response to direct user input is detailed later, it can be appreciated that regions 240 are operable to initiate the process of controlling one or more electrical switches. For example the region 240c is operable to receive direct user input and direct user input sensors 330 (in FIG. 3) behind the faceplate can initiate the turn on of switch number 2. In another example a user input region 240b of the faceplate 105 can function to act as analog switch, capable of controlling light 115a to have a value within a range of switch values (e.g. from 0 to 100). Examples of analog switches include slider actuators, dimmer switches, rotary dial switches. Physical features on the faceplate can indicate the intended function of a region. For example in FIG. 2B switch number 1 and switch number 2 can be separated by a molded feature 225 delineating the boundary between the two switches on the common faceplate. Features 225 can also be deposited on the faceplate using other technologies including printing, etching, painting, overlay or electroplating. User input regions can control a function that is variable and dynamically defined by a computer processor. Region 240d illustrate an example of a region that could initiate a plurality of control functions in a speaker application for example changing the volume, selecting a song, playing or pausing music or selecting an input source. In one implementation the function of 240d can be defined by the direction or gesture the user makes while touching the region. For example swiping up and down may control light switch functionality, while swiping from left to right may decrease sound volume of the speaker and right to left may increase sound volume. The differentiation of these functions can be provided by the sequence of sensors 330 (in FIG. 3) activated behind the front surface of region 240d. The function of region 240d can be based in part the prior sequence of regions 240 that the user has interacted with. Illuminated sections of the faceplate 130 can indicate the present functionality of region 240d.

In the embodiment illustrated in FIG. 2B speaker grille 214 occupies a large portion of the faceplate 105. In this context a large portion can range from 30-100% of the faceplate area. In one aspect of this disclosure user input regions 240 overlap with grille 214. In some embodiments user input regions can be fully contained within the grille portion of the faceplate. Speaker grilles are common on most speakers, where they provide mechanical protection for the sensitive speaker components while providing a path for sound vibrations to be emitted.

Electrical switch faceplates are required to provide electrical insulation between a user and high voltage components (e.g. wires) inside the junction box. In one aspect of the present disclosure electrical switch assembly 100 has a speaker grille 214 made from an electrically insulating material, for example plastic, glass, glass filled plastic, or ceramic. In one embodiment shown in FIG. 2A and FIG. 2B the grille and the surrounding area of the faceplate are made from the same piece of plastic, with the grille comprising a plurality of openings 120 covering the center section of the faceplate. In other embodiments the grille may be different material from the rest of faceplate, for example a plastic grille with an insulated metallic faceplate. The openings can be a wide variety of shapes (e.g. circular, square or elongated slots). A speaker grille is a combination of openings 120 and solid portions between the openings. The arrangement of openings and solid portions often forms a pattern and enhances the aesthetic appeal of the speaker enclosure. The combination of openings 120 and solid support material is designed to achieve competing goals of blocking or filtering objects larger than the grille openings while enabling air and sound waves to pass through the grille. The grille is not a perfect sound transmitter. The solid portions of the grille attenuate or diminish several physical properties such as sound intensity, light intensity and air flow. Sound attenuation can be caused by sound reflected back towards the speaker as it attempts to pass through the grille.

FIG. 2A illustrates a circuit board 260 behind the faceplate 105 and placed in front of the speaker 205. The circuit board has an insulating substrate 262 that functions to hold conductors 254 and sensor electrodes 255 operable to sense direct user input. Conductors 254 can function to carry signals to and from sensor electrodes and can have a large ratio of length to width (e.g. >100). Modern circuit board manufacturing technologies such as photolithography and foil etching can produce conductor features 254 as narrow as 40 micrometers. Electrodes are operable to sense an aspect of a user (e.g., capacitive or resistance changes associated with a user touching the front surface of faceplate 105. Electrodes can have a larger surface are and smaller aspect ratio than conductors on the same circuit board. Circuit board 260 has a plurality of openings (e.g. 220a and 220b). Openings 220a and 220b function to enable sound from the speaker 205 to pass through the substrate. Openings 220 are designed to align with openings 120 in the faceplate so as to not to add to the overall sound attenuation and reflection of the grille. In one implementation opening 220a is larger than the corresponding opening 120a in the faceplate and can be large enough to cover multiple holes in the front faceplate. In one implementation 220a can be larger than the opening 120a in the speaker grille. For example openings 220a could be a slot encompassing two openings in the faceplate. In some embodiments circuit board 260 can be a rigid circuit board made from layers of fiberglass and epoxy with deposited conductors. In other implementations circuit board 260 is a flexible circuit board. The faceplate 105 with speaker grille 214 can be combined with one or more circuit boards 260 to form an interactive grille. The interactive grille enables the switch assembly to transmit sound while accomplishing the task of switch power to household items. The switching functionality is accomplished by splitting the switching task into two functions sensing and power switching. The interactive grille enables the sensing to take place on the sound transmitting grille while the power switching is accomplished by circuitry located away from the path of sound transmission. Examples of circuitry located away from the path of sound transmission include low voltage switches and high voltage switches located behind the speaker in enclosure 210. One high voltage switch 280 is illustrated behind the speaker in FIG. 2A. In the context of this disclosure high voltage refers to voltages with magnitudes greater than 20 volts. Low voltage refers to voltages with magnitudes in the range 0-20 volts. Examples of high voltage switches include electromechanical relays, solid state relays and triacs. A triac is a fast solid state switch often used to implement dimmer switches in buildings. Grille 214 can be larger than the speaker cone 207 extend beyond the speaker in the X-Y plane, thereby providing the benefits of access to the surrounding air to additional sensors in the electrical switch assembly. The speaker cone 207 is defined by the inside perimeter of speaker flange 206. For example a microphone 268 could be placed in the housing and behind the grille, whereby the interactive grille provides improved sound coupling and therefore improved sound sensing in the vicinity of switch assembly 100. Similarly, a passive infrared sensor 269 can be placed behind the interactive grille to sense motion in the vicinity of the speaker. Openings in the grille provide enhanced motion sensitivity. In other embodiment some or all of the sensor electrodes 255 can be deposited directly onto the rear surface of the speaker grille using electroplating or conductive inks. It would be known to someone skilled in the art that conductors and electrodes can be deposited on 3-dimensional polymer parts using modern technologies such as Laser Direct Structuring (LDS) or Molded Interconnect Device MID technology.

Mounting features 256 on the housing 210 can be connected to corresponding mounting features 222 on the electrical junction box 215. For example 256 can be an oblong opening in the housing 210 and feature 222 can be a threaded hole. A screw could be used to connect 256 and 222. This arrangement enables fine adjustment of the orientation of the housing. In some embodiments additional mounting features 257a-d are operable to secure faceplate 105 to the housing 210. In several embodiments mounting features 257a-d are load sensors. This enables the faceplate to be attached to the housing in a manner enables the load sensors 257a-d to generate sensor signals when the faceplate is touched or pressed. For example mounting features 257a-d could be planar beam type load sensors such as those available from Omega Engineering INC, Stamford Conn. In some embodiments there may more or less load sensors than the four shown in FIG. 2A. In response to a user touching or swiping an area of the faceplate the timing and sequence of load sensors values can be used to determine the area touched and the motion pathway (e.g., swipe in the up direction or down direction)

Figure 3:
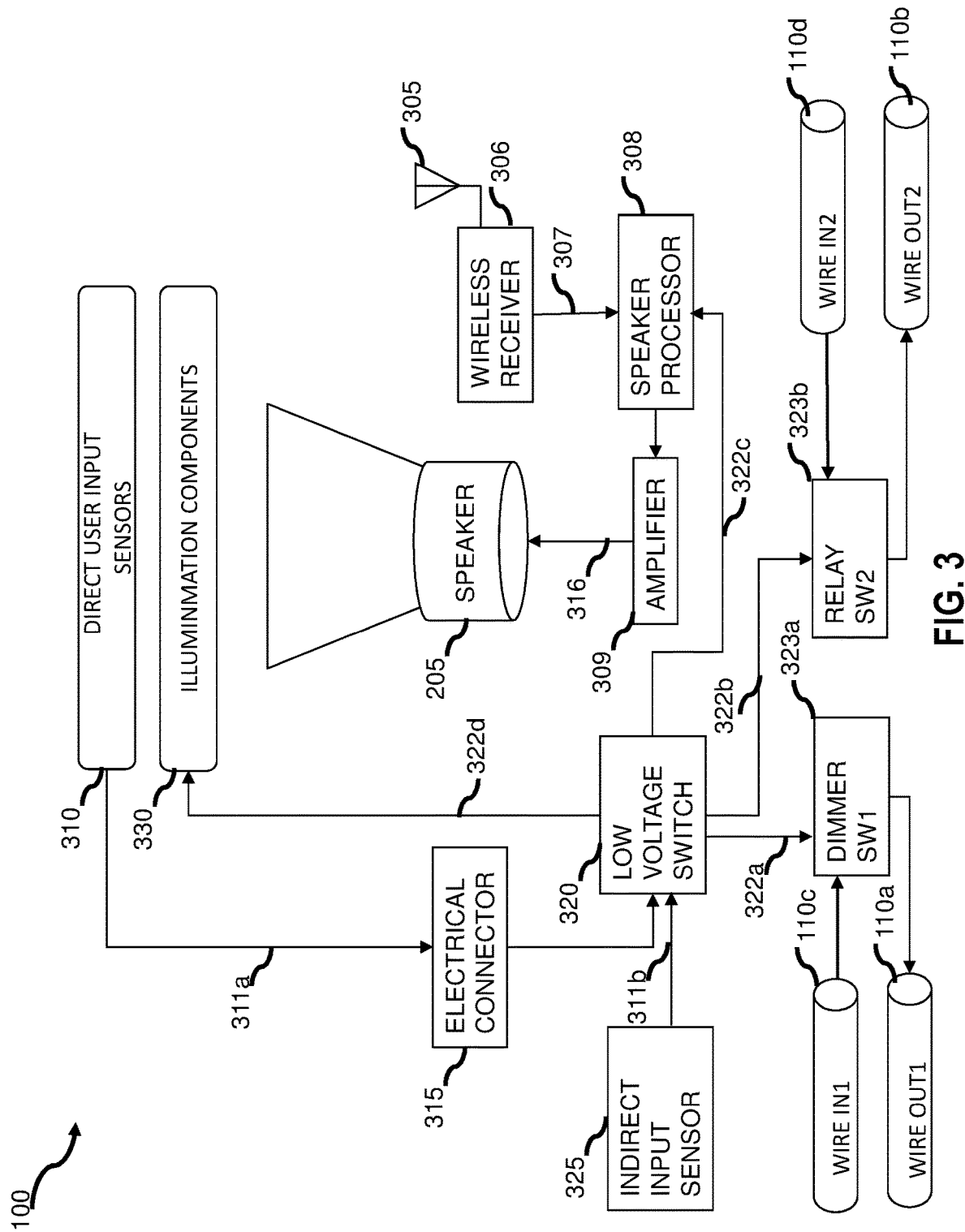
FIG. 3 is a block diagram illustrating various components of an electrical switch assembly with audio capability in accordance with one embodiment of the present technology.

FIG. 3 is a block diagram of an exemplary electrical switch assembly 100, illustrating electrical components used to provide the two functions of sound transmission and electrical switching in accordance with one implementation of the disclosure. Wireless devices 140 can transmit wireless signals 135 to the electrical switch assembly 100. Switch assembly 100 contains an antenna 305 to receive wireless signals 135. Antenna 305 can be printed on a circuit board, a discrete stamped metal component or an electroplated feature on a surface. In one embodiment of the disclosure the antenna can be deposited or attached to a subassembly including faceplate 105. On advantage of attaching or depositing the antenna on the faceplate is that placement of the antenna outside of the metal junction box can improve the antenna range and sensitivity. The antenna is operably coupled to a wireless receiver 306. Receiver 306 can be operable to receive and demodulate a variety of common wireless audio protocols such as amplitude modulated (AM) or frequency modulated (FM) radio signals (e.g. 88.9-107.7 MHz), Bluetooth, Wi-Fi or Apple Airplay®. Receiver 306 can be part of a transceiver module that also includes transmission capability. Receiver 306 transmits demodulated wireless messages 307 to a speaker processor 308. The speaker process performs operations to convert the digital wireless messages into audio frequencies. These operations can include digital-to-analog conversion, amplification, equalization, error correction, echo cancellation, bass enhancement, or introducing a delay to one or more frequency components. Speaker process 308 and wireless receiver 306 can be integrated into a single module or microchip. For example a Bluetooth wireless speaker can have a single chip receiver and speaker processor. Electrical switch assembly 100 can include an audio amplifier 309. Amplifier 309 operates to receive audio signals from the speaker processor, to increase the power of these signals and to transmit amplified audio signals 316 to the speaker 205. Amplifier 309 can be a single chip amplifier or can comprise multiple discrete transistors. Amplifier 309 can be a class A, B, A/B C or D amplifier. Amplifier 309 transmits amplified signals to the speaker. Amplifier 309 can be for a PAM1803 Class D audio amplifier available from Diode INC, Plano Tex. The amplifier 309, speaker processor 308, and receiver 306 can be housed behind the speaker, away from the path of sound transmission.

Electrical switch assembly 100 contains a plurality of direct user input sensors 310. Direct user input sensors operate to sense direct user interaction with user input regions 240 of the faceplate 105. Examples of direct user interaction include touching or pressing the faceplate. Examples of direct user input sensors include sensor electrodes 255, 605a, 605b (shown in FIG. 6) and a load sensors 257a-d. Other examples of a direct user input sensor could be a membrane switch such as found on many modern appliances such as a washing machine or stove control panel. Direct user input sensors 310 can operate to sense direct user input based on a variety of standard technologies. Examples of direct user input technology are capacitive touch sensing, resistive touch sensing, surface acoustic wave touch sensing and pressure sensing. In surface acoustic touch sensing a surface acoustic wave is generated on the front surface of the faceplate by one or more transmitters. Aspects of the reflected signals (e.g. arrival time and intensity) are used to sense a user touching the faceplate surface. In response to direct user input, sensors 310 generate direct sensor signals 311a. Direct sensor signals 311a can be current, voltage, frequency or sound intensity changes associated with user input sensed by one or more direct user input sensors 310. In some embodiments an electrical connector 315 provides two separable halves that enable electrical connections to be made between conductors 254 and one or more low voltage switches 320. One half of electrical connector 315 may be disposed on a circuit board 260 and the other side may be disposed inside the housing 210. When a person attaches circuit board 260 to the housing 210 electrical connector 315 can connect electrical signals between conductors 254 and circuitry in the housing.

In one embodiment of the present disclosure, electrical switch assembly 100 provides the two functions of sound transmission and electrical load control using touch sensitive switches. In this embodiment the grille 214 is a touch sensitive surface while the other circuitry required to accomplish electrical switching function is positioned away from the sound transmission path of one or more centrally located speakers. The exemplary electrical switch assembly 100 illustrated in FIG. 3 contains a low voltage switches 320. Other implementations may contain multiple low voltage switches. The switch can be located in housing 210. The switch can function to convert sensor signals 311a and 311b into low voltage switch output signals 322. Low voltage switch 320 can comprise a microchip or microcontroller. Many modern microcontrollers can have dedicated circuitry designed to implement low voltage touch sensitive switches. For example the Texas Instruments MSP430 processor from and the MicroChip DSPic33 processor families have analog-to-digital circuitry operable to implement the functionality of the low voltage switch 320. In some embodiments this circuitry enables conversion of direct user interaction with a surface (e.g. touching or pressing) into low voltage switch output signals 322. In some embodiments sensor signals 311 can cause small changes in in the frequency of an oscillating circuit inside the low voltage switch 320. The processor is operable to measure these frequency changes and control one or more low voltage switch output signals 322 based on frequency changes. This type of frequency measurement is often used to transduce sensor signals from capacitive touch sensors. Several electrodes can be sequentially connected to a frequency measurement circuit inside low voltage switch 320 and switch 320 can identify when the user touches one or more of a large number (e.g. >50) of distinct regions on the faceplate 105. In other embodiments the low voltage switch 320 can include an analog-to-digital converter operable to sense small changes in voltage from sensors and generate digital values corresponding to the magnitude of sensor signals 311. A processor in the low voltage switch 320 can have a preset threshold for the change in magnitude or frequency that would correspond to a user touching the faceplate. When the low voltage switch 320 measures a change in frequency or magnitude sufficient to cross this threshold the state of an output pin on the low voltage switch can be changed. The change in state of the output pin can act as a low voltage switch output signal 322. In other embodiments low voltage switch 320 can include one or more elements designed to increase the output power of a low voltage switch signal. This process is sometimes called "buffering" and can be performed for the purpose of controlling high voltage switches 323. Examples of components that can perform buffering include power transistors and relays.

In some embodiments the low voltage switch 320 can accept a large number of sensor inputs 311 and can produce a large number of low voltage switch output signals 322, where a large number is for example fifty or more. In this way the low voltage switch can transduce a plurality of sensor inputs into distinct switch output signals. In some embodiments this circuitry enables conversion of direct human interaction with a surface (e.g. touching or pressing) into output voltage signals. In other embodiments the low voltage switch can combine several sensor signals 311a and 311b, perform one or more calculations using a computer processor in the low voltage switch 320 and generate one or more low voltage switch output signals 322. For example low voltage switch 320 can receive a direct sensor signal 311a when a user touches the multifunctional grille 214 and second sensor signal 311b from a motion sensor 269 when a person moves in front of the grille openings. Low voltage switch 320 can contain a processor that can combine direct sensor signals 311a and indirect sensor signals 311b and generate an output signal. In some embodiments the low voltage switch can perform timing calculations to determine when to generate an output signal. For example electrical switch assembly 100 can receive direct sensor signals 311a from the region 240a of the faceplate operable to turn off a light 115a. About the same time low voltage switch 320 and can receive indirect sensor input 311b indicating a person moving in the vicinity of the switch assembly 100. In response to 311a and 311b low voltage switch 320 can delay the transition of signal 322 to an OFF state by a few seconds in order to provide light while the person leaves the vicinity. In the context of this disclosure an ON state can be considered as having a voltage with a magnitude that is greater than a sizeable portion (e.g. >20%) of a power supply voltage (e.g. 5V) used to operate a low voltage switch 320. In the context of this disclosure an OFF state can be considered as having a voltage with a magnitude that is less than a sizeable portion (e.g. <20%) of a power supply voltage used to operate low voltage switch 320. The power supply voltage can be measured relative to a reference voltage supplied to the low voltage switch, often defined as a ground voltage or 0V. Low voltage switch 320 can include circuitry to operate one or more illumination components 330. Illumination components 330 can be LEDs or electroluminescent segments, incandescent bulbs or fluorescent bulbs. Illumination components 330 can be switch position indicator lights operable to indicate to a user the output state of one or more high voltage switches 323 or low voltage switch output signals 322.

In other embodiments electrical switch assembly can include one or more illumination components 330. Illumination components 330 can be operable to illuminate portions 130 of faceplate 105 and can be located on a circuit board located behind the front surface 212 of the faceplate. Connector 315 can also provide a junction for low voltage switch output signals 322*d* from a low voltage switch 320 to illumination components 330. Low voltage switch 320 can operate illumination components 330 (e.g. switch position indicator lights) in response to sensor signals. For example in response to a user touching a region of the faceplate, low voltage switch 320 can operate illumination components 330 to illuminate sections of the faceplate 130*a* and 130*b* indicating the present state of each of two dimmer switches. In another example a passive infrared sensor (PIR) could sense a person in the vicinity of electrical switch assembly 100 and signal low voltage switch 320 to illuminate regions 130*a* and 130*b* of the faceplate corresponding to the present value of low voltage switch output signals 322*a* and 322*b* (indicating the dimmer output to switch number 1 and ON-OFF position of switch number 2 respectively).

Low voltage switch output signals 322 are operable to control high voltage switches (e.g. 323*a*) and other aspects of the electrical switch assembly 100. Low voltage switch output signals 322 can be voltages in the range of minus 20 volts to plus 20 volts relative to ground in the junction box, the neutral wire or a local ground reference voltage supplied to both the low voltage switch 320 and the high voltage switch 323*a*. In one implementation low voltage switch output signal 322*a* is a pulse width modulated signal (PWM) containing a series of pulses. Pulses contain two or more distinct voltage levels; a high state and a low state voltage. By varying the time proportions of high and low state voltage the PWM voltage waveform voltage switch output signal 322*a* can control the dimmer switch 323*a*. Other low voltage switch output signals 322*b* can operate electromechanical relays 323*b*. Signals 322*b* can supply a current to an electromagnet inside relay 323*b*, thereby creating a low resistance connection between wires 110*b* and 110*d*. In this context a connection with resistance<3 ohms can be considered a low resistance connection. Other low voltage switch output signals 322*c* can be transmitted to the speaker circuitry. FIG. 3 illustrates low voltage switch output signals 322*c* transmitted to the speaker processor 308. For example illumination components 330 can be used to indicate the volume of speaker 205 as an illuminated section 130*a* on faceplate 105. Grille 214 can additionally provide an active region 240*d*. In response to user interaction with 240*d* direct input sensors 330 can generate sensor signals 311*a* and cause low voltage switch 320 to signal speaker processor 308 to change the volume of the speaker. In another implementation low voltage switch output signal 322*b* operates a solid state relay, in which the moving parts of an electromagnetic relay are replaced with power transistors.

Electrical switch assembly 100 can contain a variety of other components and circuits. For example switch assembly 100 can contain a rectifier or diode rectifier to convert high voltages to low voltages, a battery to power the speaker or low voltage switches, particularly during a power outage to the building where the switch assembly is located. Electrical switch assembly 100 can contain one or more visual displays operable to be seen through faceplate 105.

In some alternative embodiments amplifier 309 can be contained within speaker processor 308. In other embodiments speaker processor 308 and low voltage switch 320 can be combined in a general purpose processor that combines the ability to sense user input and generate sound signals using digital-to-analog conversion or pulse width modulation. An example of a processor that could combine the functionality of speaker processor 308 and low voltage switch 320 is the DSPic33 processor family from Microchip Incorporated. In one embodiment of electrical switch assembly 100, the functionality of one or more touch sensitive regions 240 can be determined by the present state of one or more low voltage switch output signals 322*a* or 322*b*. For example when a user walks into an room where the lights are OFF, low voltage electrical switch 320 can identify that one or more low voltage output signals 322 correspond to the light being in the OFF position and can interpret signals 311*a* from some or all touch regions 240 as indications to turn on the light. In this way the electrical switch assembly can identify direct user interaction and estimate the associated intent based on the output state of one or more electrical switches (e.g. 323*a*). When a person enters a dark room they often reach for the light switch and use the tactile feel of the switch as user feedback. In one example electrical switch assembly could devote sensor signals 311*a* from user interaction with some or all of the surface of the grille to the function of turning on a light in this scenario, thereby alleviating the user from the burden of touching a particular ON location (e.g. 240*c*). In this example an indirect input sensor (e.g., a light level detector) located behind the speaker grille could supply sensor signals 311*b* to a low voltage switch 320, indicating the light level in the room and enabling the low voltage switch to interpret sensor signals 311*a* from a larger number of direct user input sensors 310 as indication to operate a high voltage switch to turn on a light. In another example, indirect user input sensors 325 (e.g. a PIR sensor or proximity sensor) could sense a person who has entered a dark room and illuminate one or more regions 130 of faceplate 105. The indirect input sensor can benefit from placement behind the grille 214 with a large density of openings 120 that enhance motion signal intensity. In one aspect the electrical switch assembly can illuminate features 130 with increasing intensity as person gets closer to the faceplate (e.g. as they reach for the switch), thereby avoiding unnecessarily disturbing a person who is moving in the vicinity of the electrical switch assembly and does not intend to operate an aspect of the assembly. Dynamic intensity variation can be controlled in part by sensing a person with a plurality of different sensing technologies. For example a faceplate can glow with a low intensity when a person is sensed on a long range PIR sensor (e.g. with 10 meter range). The faceplate can glow with a higher intensity if the person is subsequently sensed by a shorter range proximity sensor (e.g. active infrared transceiver).

FIG. 4A illustrates several exemplary components of electrical switch assembly 100 designed to enhance audio performance while enabling electrical switch functionality in according with embodiments of this disclosure. Two circuit boards 260 and 460 are positioned behind the faceplate 105. Circuit board 260 contains a plurality of openings 220 and circuit board 460 contains a plurality of openings 420. It can be appreciate that the density and shape of openings in the grille 214 can be chosen to fulfill the competing goals of sound transmission and mechanical performance (e.g. electrical isolation and speaker protection). By choosing the size and shape of openings 220 so as not to cover openings 120 with substrate material 262 the sound transmission properties of the faceplate 105 can be preserved. In particular by aligning one or more openings 220 and 420 with the grille openings 120 the sound transmission performance becomes determined primarily by speaker grille 214. In the context of this disclosure an opening 220 can be considered to "align" with an opening 120 when the placement of 220 is such that the area of the unobstructed opening formed by the overlayed combination of 120 and 220 when viewed along an axis is at least half the area of the corresponding opening 120. For example 220a and 120a are considered aligned in FIG. 2A because when assembled the area of opening 120a and the area of the opening when 120a and 220a are in an assembled state is essentially equal. Opening 220a is made larger than 120a to ensure that any small misalignment of circuit board 260 and faceplate 105 following assembly does not cause 220a to impede sound transmission from speaker 205. In another example openings 120b and 220b and are considered aligned when the electrical switch is assembled. By aligning one or more openings in the faceplate 105 and circuit boards (e.g. 260 and 460) the present disclosure enables the circuit boards to add functionality to the grille while transmitting sound from the speaker. For example circuit boards 260 and 460 can provide mounting surfaces to hold touch sensor electrodes, indicator lights, and environmental sensors such as a temperature sensor 480. In one implementation a connector 315 is used to connect circuit board 460 to one or more low voltage switches 320. In the context of this disclosure the improved sound transmission as a result of aligning openings in the grille 214 and a circuit board can include, higher volume experienced in the region in front of the grille, decreased reverberation caused by reflected sound from grille 214 and the circuit board and improved audio clarity.

Circuit board 260 can be comprised of transparent conductors and a transparent substrate similar (e.g. clear plastic) to the touchscreens on tablet PCs. Transparent elements on circuit board 260 enable light illumination components 330 (e.g. light emitting diodes 470 and electroluminescent regions) on circuit board 460 to illuminate portions (e.g. sections 130) of the faceplate.

Figure 4B:
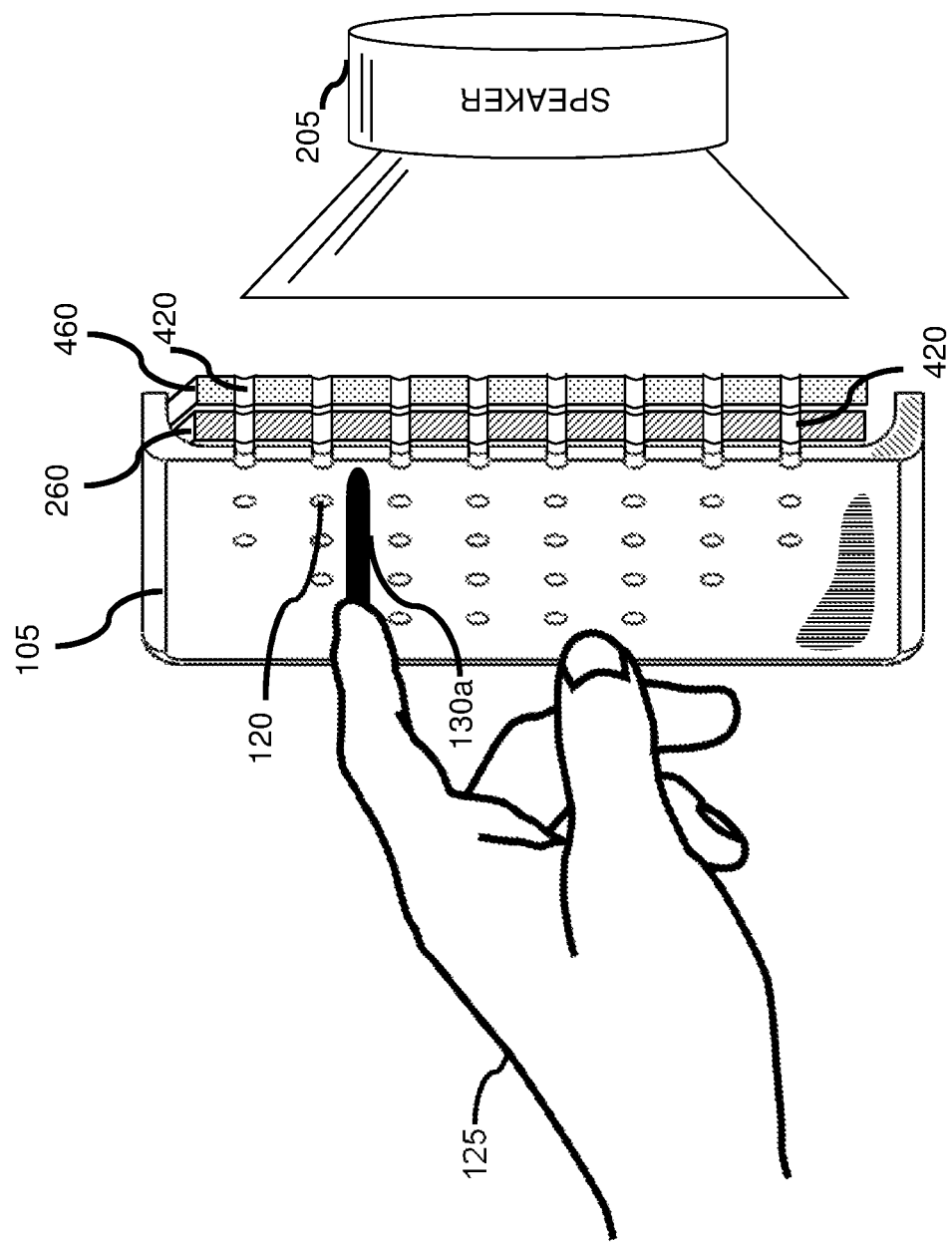

Conductive elements 255 can also be a transparent material such as indium tin oxide (ITO), antimony tin oxide or silver filled ink. In one implementation an interactive faceplate subassembly 485 is comprised of the faceplate 105 and circuit board 260. The interactive faceplate subassembly 485 can be attached to the other components of the electrical switch assembly by a user or installer. Interactive faceplate subassembly 485 enables the alignment of one or more openings 120 and openings 220 to be conducted in a controlled manufacturing environment. Interactive faceplate subassembly 485 further facilitates installation by enabling installation of other electrical switch assembly components (e.g., the speaker 205 and housing 210) into the junction box 215 prior to installation of the faceplate. This order of installation can help to avoid damaging sensitive sensor electrodes 255 in the interactive faceplate subassembly 485. In another implementation interactive faceplate subassembly 490 includes an additional circuit board 460 operable to illuminate features on the faceplate. Connector 315 can be disposed on a pigtail or a portion of flexible PCB designed to facilitate connection between the two halves of the connector. Connector 315 could be comprised of exposed connector electrodes at the end of a flexible PCB pigtail. Connector 315 can connect with a corresponding connector in the housing 210, for example a zero insertion force connector (ZIF) such as those sold by TE Connectivity from Harrisburg Pa. In other implementations interactive faceplate subassembly 490 has plurality of connectors similar to 315. Using more than one connector 315 provides redundancy in case a connector pin becomes dirty or damaged. One or more of the connectors can implement a safety interlock, thereby ensuring that portions of the electrical switch assembly 100 are not energized with high voltages until faceplate subassembly is properly secured and the connector 315 is correctly mated. In one embodiment interactive faceplate subassembly 490 has four connectors similar to 315, with one located at each corner of the faceplate to provide a means to both attach and provide power to subassembly 490. Interactive faceplate subassembly 490 has several additional advantages. The subassembly can be provided in a variety of colors, shapes and sizes to fit aspects of the wall opening and the user's preferences. Similarly, the size and pattern of grille member 214 can be varied as well as the color of illuminated sections 130. In contrast the portion of electrical switch assembly 100 inside the junction box 215 can be standardized and offer less customization. FIG. 4B illustrates a crossectional view of the speaker grille subassembly 490 including aligned openings. Speaker 205 is shown for reference.

Figure 5B:
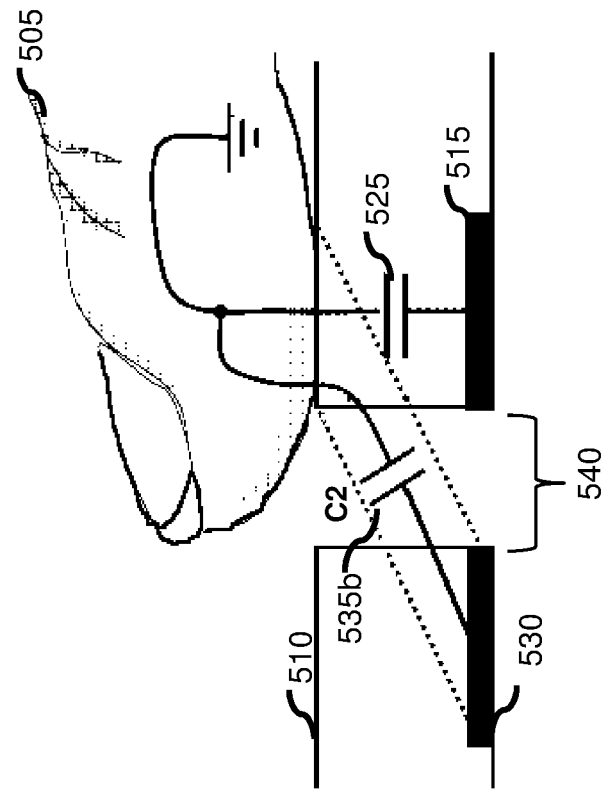
Figure 5A:
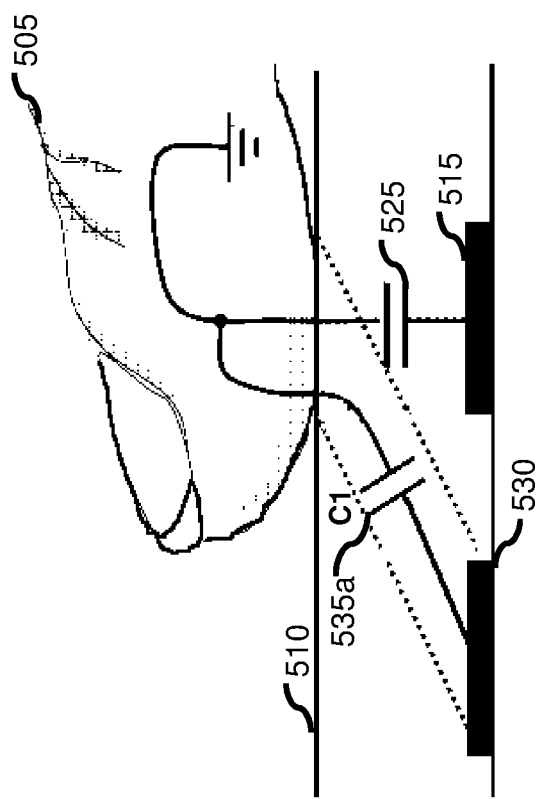

FIG. 5A and FIG. 5B illustrate the basic operating principle of capacitive sensing. A number of standard technologies can be adapted to provide user input sensing in the presence of a large speaker 205 and pluralities of holes 120 220 and 420. These technologies include capacitive touch sensing (illustrated in FIGS. 5A and 5B), and resistive touch sensing, surface acoustic wave touch sensing and load sensing. A finger 505 is placed over a layer of insulating material 510. A target electrode 515 is disposed behind layer 510. Electrode 515 has a background capacitive coupling to a ground electrode similar to 495. When a finger or other object directly interacts with the top surface of layer 510 the capacitance 525 is often increased. The increase in capacitance causes a temporary current to flow in a conductor such as 254 connecting the sensor electrode 255 to a low voltage switch 320. This current constitutes a direct sensor signal 311a. FIG. 5B also illustrates an advantage of the present design. When a finger touches a conventional capacitive touch sensor, over a target electrode 515, as illustrated in FIG. 5A there is an unintended signal generated at a neighboring electrode 530. It is desirable to reduce this cross-capacitance signal 535a and 535b. FIG. 5B illustrates a capacitive touch sensor in accordance with one implementation of this disclosure. There is an opening 540 in the insulating layer 510 between the target and neighboring electrodes. This opening can be opening 120 in the grille 214. This opening reduces the cross capacitance 535b between the finger 505 and the neighboring electrode 530. By reducing the undesirable cross-capacitance from 535a to 535b the present disclosure enables electrodes 515 and 530 to sense more accurately or be placed closer together. In the present disclosure a plurality of holes 120 in the faceplate 105 can cross-capacitance (C2<C1), thereby enabling improved special resolution of touch identification. Yet another advantage of the present assembly is illustrated in FIG. 5C whereby the target capacitance 530 can be increased by extending target electrode 515 at least some of the way into opening 540. The extended section is illustrates as the shaded portion 517 of the target electrode in FIG. 5C. One way to implement this electrode extension is to increase the plating thickness of electrode 515 close to opening 540. Electrode 515 and 530 are examples of direct user input sensors 310.

Figure 6:
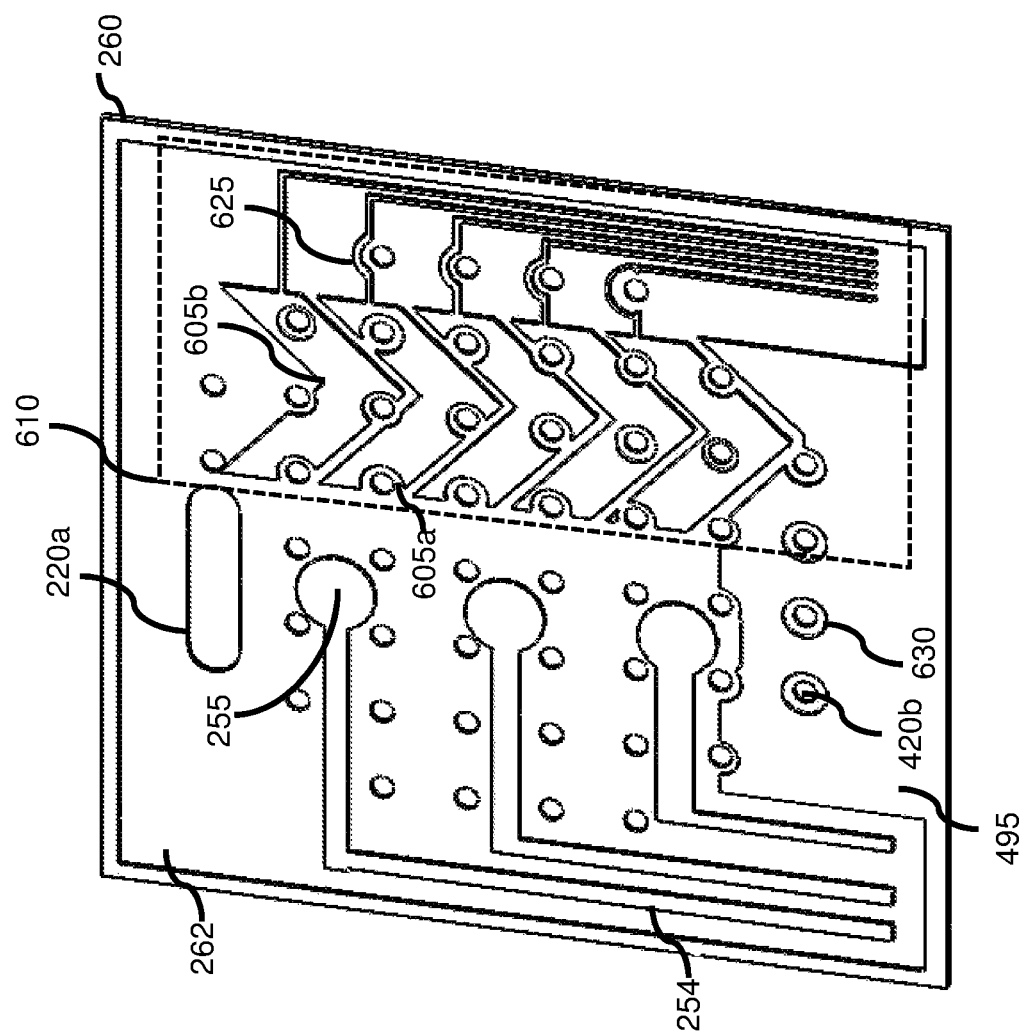
FIG. 6 illustrates an insulating electrical substrate with conductive electrodes designed in accordance with one embodiment of the present technology.

FIG. 6 illustrates an exemplary electrode array designed to enable a touch sensitive speaker grille in accordance with one implementation of this disclosure. A variety of sensor electrodes including 255, 605a and 605b are patterned on insulating substrate 262. Sensor electrodes are operable to sense direct user interaction with a variety of regions 240 of faceplate 105. The exact layout of sensor electrodes and regions 240 will vary from one implementation to another. Electrode 255 is a discrete sensor electrode designed to identify direct user interaction with a binary input region of the speaker grille. 605a and 605b are electrodes designed to nest within one another such that a user's finger is sensed by 2 or more electrodes at most times. Region 610 includes 5 nested electrodes and is used to implement a slider touch function. When a user slides their finger up or down within the dimmer region 240b of the faceplate 105 and grille 214, multiple electrodes in the touch slider electrode region 610 sense the direct user input and send sensor signals 311a to the low voltage switch 320. The low voltage switch can interpolate the sensor signals and estimate the placement of the user's finger on the touch sensitive region of the faceplate and grille. Circuit board 260 includes a ground electrode 495 that acts as a reference for the other electrodes. Circuit board 260 has a plurality of openings 220 places in accordance with aspects of this disclosure so as to enhance sound transmission. The size and location of openings 220 are chosen to align with openings 120. Conductors and electrodes can be routed around openings 220 as illustrated at 625. In some cases one electrode can be connected to multiple conductors 254. The conductors can be routed in different paths around openings 220 to account for the presence of plurality of openings 220. A person of skill in the art would appreciate that a dense plurality of openings can be placed on substrate 260 and modern circuit board layout software is well suited to routing conductors and electrodes within the small portion of solid substrate 262 that can remain. Openings 420 and 220 can have a guard ring 630 around the opening, whereby the guard ring is a ring around the opening without electrode material (e.g. copper foil). Guard ring 630 can ensure that a user cannot see or touch the edge of an electrode.

Figure 7:
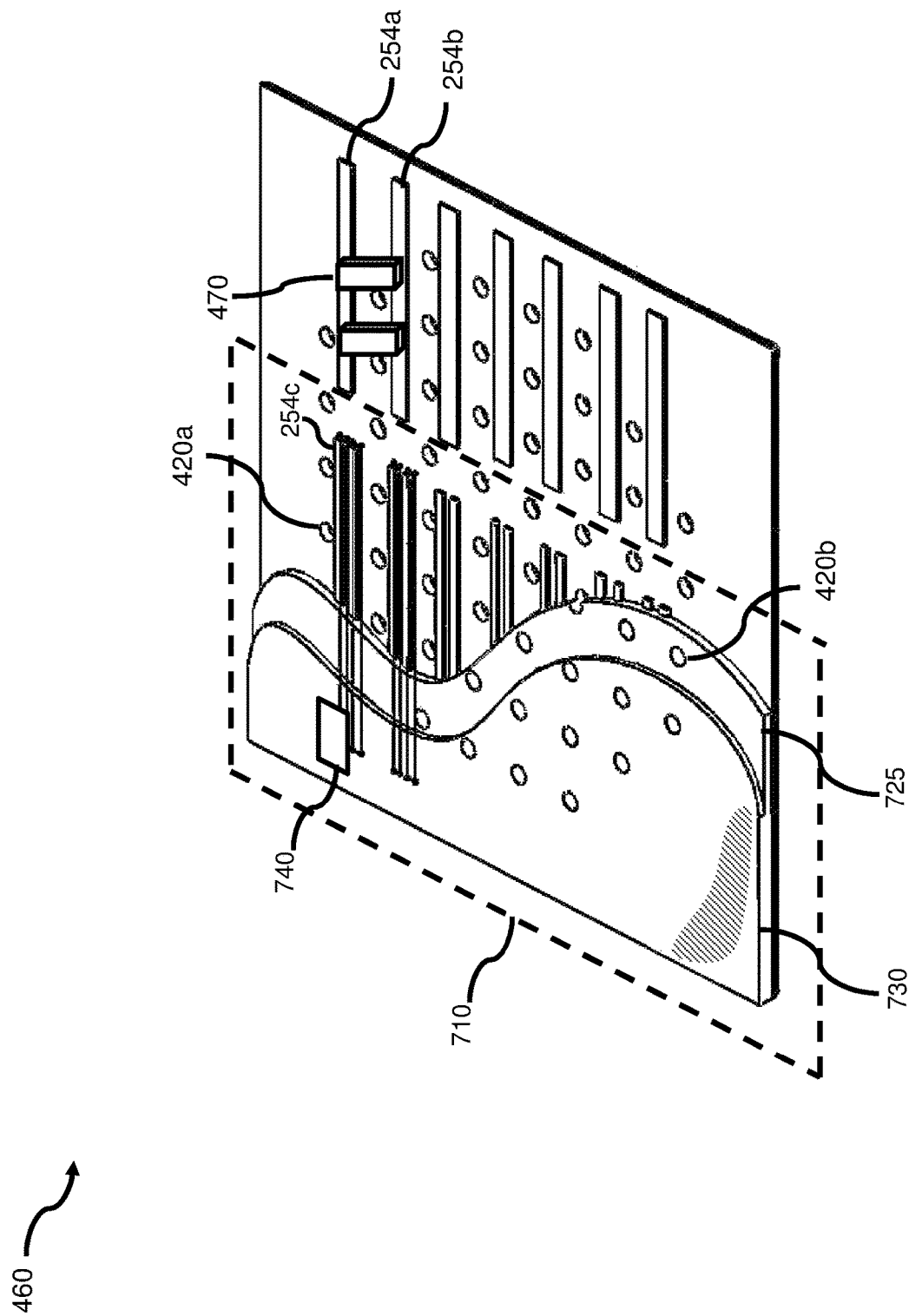
FIG. 7 illustrates various elements of an indicator light assembly including insulating electrical substrate with light emitting elements in accordance with one embodiment of the present technology.

FIG. 7 illustrates an exemplary circuit board 460 designed to illuminate regions 130 of the faceplate 105. Light can be generated on circuit board 460 using a variety of technologies including light emitting diodes (LEDs) or electroluminescence (EL). In the embodiment illustrated in FIG. 7 two emitting diodes 470 are electrically connected between two conductors 254a and 254b. Light emitting diodes 470 can be electrically connected to circuit board 460 while enabling a plurality of openings 420 to align with openings 120 in grille 214. In this manner the LEDs can be used to illuminate sections of the faceplate 105 while the circuit board 460 does not diminish the sound transmission performance of the electrical switch assembly.

Section 710 of circuit board encloses a region operable to produce illumination by a process of electroluminescence. Electroluminescent materials light up when current passes through them. A variety of electroluminescent paint kits are available for circuit board applications, for example the Luxprint® Electroluminescent products from Dupont. Conductors 254c are deposited on substrate 460 to define the shape of the electroluminescent region. Conductors 254c can have close proximity (e.g. 100 micrometers) thereby enabling intricate conductor shapes to be illuminated. A dielectric layer 725 covers the conductors 254c. The dielectric layer has a high electrical resistance relative to the underlying conductor 254c. Dielectric layer 725 can comprise a high dielectric constant material such as barium titanate. The dielectric layer can alternatively be a solder mask material deposited on the circuit board 460. An electroluminescent material 730 covers the dielectric layer. Common electroluminescent materials include phosphor and zinc sulfide. One or more top electrodes 740 covers the electroluminescent layer 730. In this embodiment the top electrode is a transparent electrode such as ITO on a clear plastic film. Alternating voltage applied to electrodes 740 and 254c causes the overlapping regions of the electrodes 740 and 254c to be illuminated. In some embodiments electrode 740 is large and covers a substantial portion of the circuit board 460. The electroluminescent region 710 can be particularly useful for providing a user with visual feedback regarding the state of one or more analog 322a outputs from a low voltage switch 320. For example region 710 can illuminate a dimmer switch position on the faceplate, thereby guiding the user's finger to touch the region of the faceplate corresponding to the present dimmer location and raise or lower the light level by dragging their finger to a new location. Conductors 254c can be closely spaced and can be energized in sequence as the user moves their finger on the faceplate, thereby tracking the user's finger with illumination from the original dimmer position to the new dimmer level. Electroluminescence can produce complex light patterns, based on the shape of conductors 254c. Electroluminescent illuminated regions 710 produce enhanced line edge definition in comparison to LED technology. Conductors 254c can be patterned so as to circumvent the openings 420. In this manner the electroluminescent region 710 can be used to illuminate sections of the faceplate 105 while the circuit board 460 and openings 420 enhance the sound transmission performance of the speaker 205.

Figure 8B:
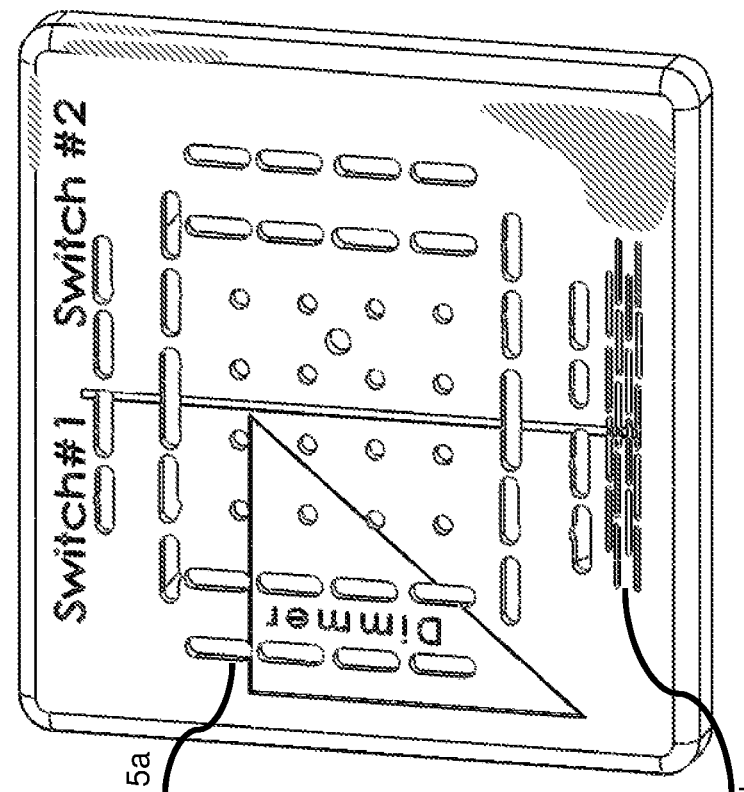
FIGS. 8A and 8B illustrate exemplary front views of a faceplate with a speaker grille operable to sense direct user interaction in accordance with one embodiment of the present technology.
Figure 8A:
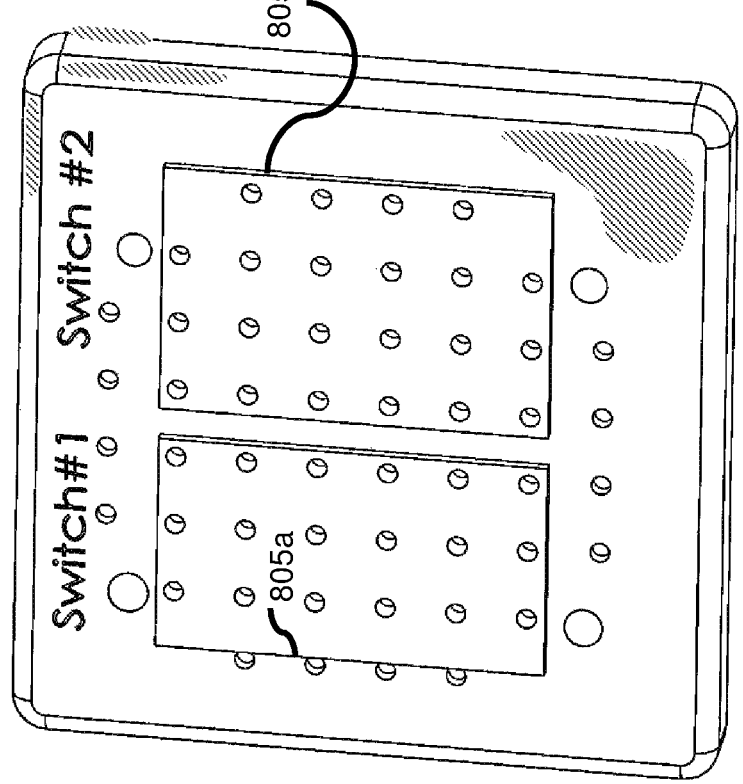

FIGS. 8A and 8B illustrate two additional embodiments of the faceplate 105 of electrical switch assembly 100. In FIG. 8A molded features (e.g. 805a and 805b) on the faceplate can indicate touch sensitive areas. The raised areas can occupy a large portion of the faceplate. The size and shape of openings 120 can be designed to enhance sound performance and switch functionality. In FIG. 8B a plurality of vertical slots 815a are disposed in a touch sensitive faceplate 105. The openings 815a can be designed to produce a characteristic sound and sequence of direct user input sensor signals 311a electrode when a user moves their finger in a vertical manner on the dimmer section of the touch sensitive faceplate 105. In another example, a pattern of horizontal slots 815b can be arranged to cover a sensor disposed behind the grille (e.g. a passive infrared sensor 269). In this case the openings can be optimized to provide more openings with less space between openings in order to enhance sensitivity of PIR 269 to motion.

Figure 9:
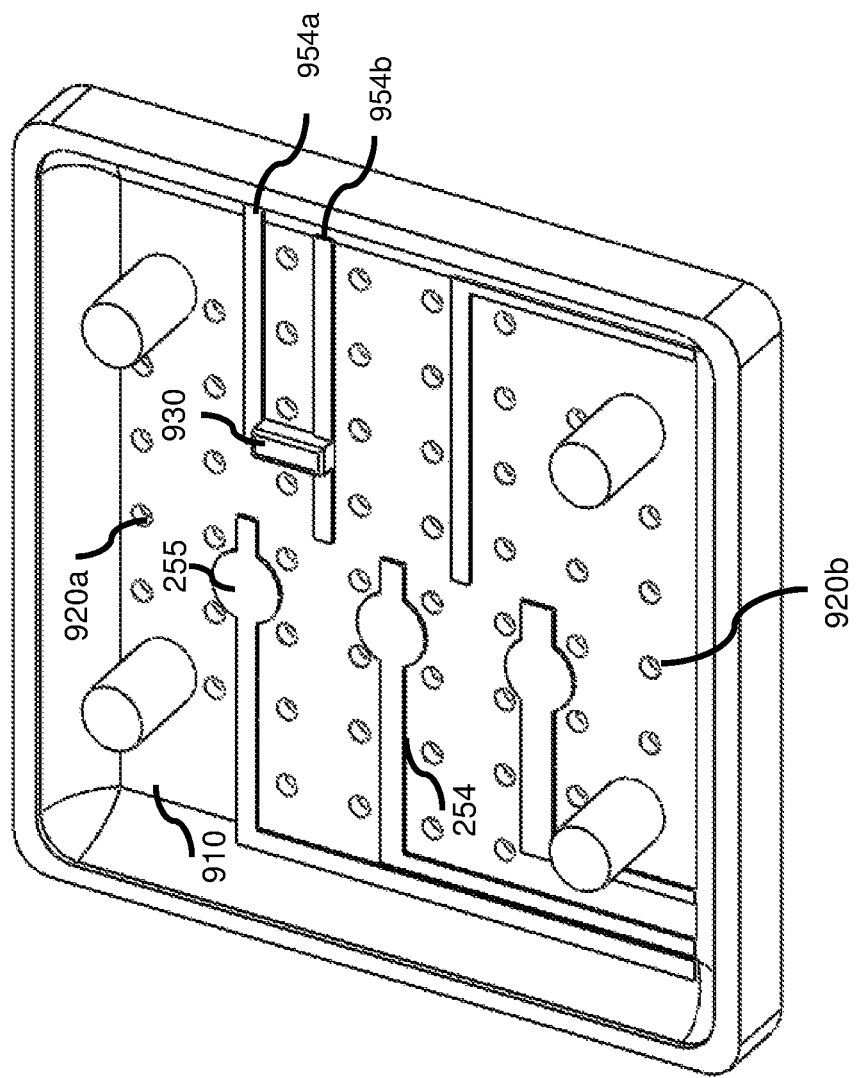
FIG. 9 illustrates an exemplary rear view of a faceplate with a touch sensitive speaker grille in accordance with one embodiment of the present technology.

FIG. 9 illustrates an exemplary rear view of a faceplate with a touch sensitive speaker grille in accordance with one embodiment of the present technology. In this embodiment electrodes 255 and conductors 254 are deposited directly onto the rear surface of the faceplate 105. Electrodes 255 and conductor 254 can be deposited using a variety of technologies including conductive ink or laser direct structuring LDS or selective plating. Electrodes 255 and conductors 254 are deposited on an interior surface 910 of faceplate 105. Surface 910 contains a plurality of openings 920a and 920b that align with openings 120a and 120b in the front surface of the faceplate, and thereby enhance sound transmission from a speaker that can be placed behind faceplate 105. An electronic component (e.g. an LED, thermistor or resistor) is attached to the faceplate and electrically connected to conductors 954a and 954b. This implementation enables one or more electronic components to be disposed on the rear surface of the faceplate while not impeding sound transmission from the speaker 205. One or more electronic components 930 could be used with electrodes 255 to implement an indicator light that is locally controlled by signals 311a generated at touch electrodes 255 and do not need to be processed by low voltage 320 in order to generate illumination control signals. Another advantage of the implementation illustrated in FIG. 9 is that alignment of the openings 120 in the faceplate and openings 920 in touch electrode substrate can be enabled by a single molding operation. In particular, the step of aligning a separate substrate (e.g., 260 in FIG. 2) is eliminated. Direct structuring technologies such as LDS are well suited to routing narrow (<100 micrometer) conductors 254 around a plurality of closely spaced openings 920.

Other Embodiments

Figure 10:
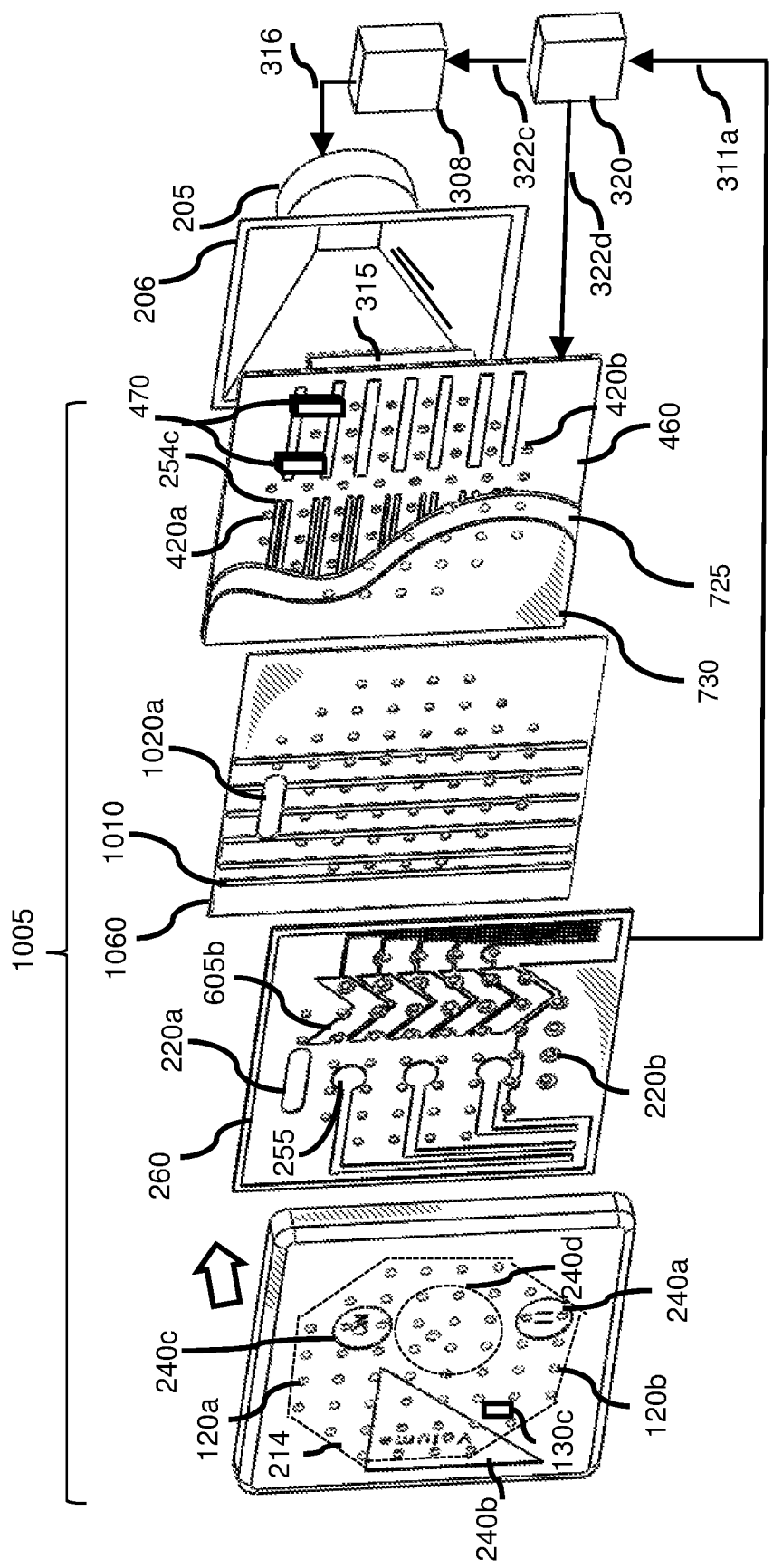
FIG. 10 illustrates is a disassembled view of an interactive speaker grille in accordance with an embodiment of the present invention.

FIG. 10 illustrates an interactive speaker grille in accordance with several aspects of the present disclosure. Interactive speaker grille 1005 is designed to transmit sound from a speaker 205, and contains portions that are touch sensitive and operable to illuminate distinct features on the speaker grille. Interactive grille 1005 comprises a faceplate 105 and three circuit boards 260, 1060 and 460 located behind the faceplate and in front of speaker 205.

Sound transmission is enhanced by aligning a plurality of openings on faceplate 105 and circuit boards 260,460 and 1060. Faceplate 105 has a plurality of openings 120 that form a speaker grille 214. When assembled, opening 120a aligns with openings 220a 1020a and 420a and thereby promotes sound transmission from speaker 205 to the area in front of faceplate 105. It can be appreciated that a large number of the openings comprising speaker grille 214 can be aligned with similar openings on one or more circuit boards to promote sound transmission. The speaker grille 214 contains a plurality of regions 240 in which direct user interaction (e.g., touching or pressing) can be sensed by a plurality of electrodes 255 and 605 disposed behind faceplate. FIG. 10 illustrate four exemplary regions 240a, 240b, 240c and 240d wherein direct user input is operable to be sensed by one or more sensor electrodes 255, 605a and 605b on circuit board 260. For example direct use interaction (e.g., touching or pressing) with region 240c causes sensor electrode 255 to generate direct user input signals 311a. In another example region 240b of the faceplate 105 can function to as analog switch. The placement position of a user's finger within region 240b indicates a desired user input value to a low voltage switch 320 within a range of switch values (e.g. from 0 to 100). Region 240d is an example of a multipurpose touch sensitive region of speaker grille 214. Area 240d can to control a variety of functions in a speaker application for example changing the volume, selecting a song, playing or pausing music or selecting an input source. The function of region 240d can be based in part the prior sequence of regions 240 that the user has interacted with. Illuminated sections of the faceplate, for example 130c) can indicate the present functionality of region 240d. Circuit board 260 contains a plurality of electrodes 255, and 605b operable to sense direct user interaction with speaker grille 214. Electrodes 254 carry direct sensor signals 311a to a low voltage switch 320. Electrodes 254 are routed around the plurality of openings 220.

Sections of the interactive grille 1005 can be illuminated by light generating components 470 (e.g. LEDs or organic LED) or electroluminescent sections 710 (illustrated in FIG. 7). Light generating components 470 and electroluminescent sections 710 can be placed on a circuit board 260 with touch electrodes or can be placed on additional circuit boards behind the touch sensor electrodes 255 and 605b. FIG. 10 illustrates an LED 470 on circuit board 460 and an electroluminescent section (shown as 710 on FIG. 0.7). The electroluminescent section 710 contains the electrodes 254c, dielectric layer 725 and electroluminescent layer 730 described previously in this disclosure. In the implementation of FIG. 10 the top electrode 740 is replaced by a plurality of electrodes 1010 disposed on a third circuit board 1060. This arrangement enables horizontal electrodes 254c and vertical electrode 1010 to be operated by signals 322d (illustrated in FIG. 3) from a low voltage switch 320 and thereby generate an illuminated region 130c on faceplate 105. Pixel 130c on faceplate 105 is above the region where the two electrodes cross. It can be appreciated that similar pixels of light can be generated at a large number of locations where a horizontal and vertical electrode pass over one another. It can be appreciated that the pixels can be disposed around the plurality of openings 120 and can form a variety of patterns operable to convey information to a user. In one implementation multiple illuminated pixels such as 130c can display the function of a multipurpose active region 240d for example displaying the volume of the speaker. In another example an array of pixels 1030 can display an equalizer, indicating the sound volume of particular frequency bands (e.g. 1000-2000 Hz). Such equalizer displays are common on multispeaker music systems such as the Kenwood GE 100 and provide an aesthetic appealing graphical display for the user. A plurality illuminated regions 130c can also generate patterns operable to change shape or intensity in time with the beat of a song. It would be understood by a person of skill in the art that an array of pixels capable of illuminating individual portions of the speaker grille 214, disposed around a plurality of openings 420a and 420b can also be implemented by a plurality of discrete light emitting light elements 470, such as LEDs, organic LEDs, incandescent lamps or fluorescent lamps.

Electrodes 1010 can be made from a transparent material (e.g. indium tin oxide (ITO), antimony tin oxide (ATO) or silver ink) and thereby enhance light transmission from electroluminescent layer 730 or discrete illumination devices 705. In FIG. 10 direct sensor signals 311a are transmitted to low voltage switch 320. Low voltage switch output signals 322d can be transmitted to electrodes 254a and 254b to control illumination of light emitting elements 470. Light emitting elements 470 are examples of illumination components 330 in FIG. 3. Other low voltage switch output signals 322d can be transmitted to electrodes 254c and 1010 to control illumination of some or all of electroluminescent region 710 (illustrated in FIG. 7). In general a large number of low voltage switch output signals 322d can be used to operate a plurality of illuminated components 330 (e.g. discrete light emitting elements 470 or electroluminescent region 710) disposed around a plurality of sound transmitting openings 420a and 420b, thereby illuminating sections 130 of speaker grille 214. Direct sensor signals 311a can also be used by low voltage switch 320 to generate low voltage switch outputs 322c operable to control aspects of a speaker processor 308. For example a user's finger can touch region 240b of the interactive speaker grille and cause sensors in slider region 610 (illustrated in FIG. 6) to send signals 311 to low voltage switch 320. The switch can in turn use signals 311a to generate low voltage switch output 322c indicative of the position of the user's finger on the volume slider portion of the faceplate. Speaker processor 308 can use signals 322c to control the magnitude of signals 316 to the speaker 205. In one aspect of the present disclosure, low voltage switch 320 can also produce outputs 322d operable to control illumination of the section of the faceplate behind 240d thereby indicating to the user the volume control value. In FIG. 10 circuit board 260 and 1060 can be transparent and contain transparent conductors so as to facilitate illumination of distinct portions of the faceplate by illumination components 705 and 710 on circuit board 460.

Interactive speaker grille 1005 can enable touch sensitive and illuminated regions of the speaker grille using one or more circuit boards disposed behind the grille have one or more openings that align with the openings forming the grille. FIG. 10 illustrates three circuit boards 260, 460 and 1060 in part to illustrate the arrangement of components (e.g. LEDs and electrodes) on individual substrates. It can be appreciated the same touch sensing and illumination functionalities can be accomplished by combining the individual circuit boards 260, 460 and 1060 into a variety of multiple-layer circuit boards. For example circuit boards 260 and 1060 can be two separate transparent circuit boards or can be combined into one transparent circuit board with touch electrodes 605*a* and 255 disposed on the surface facing the interactive grille 214 and illumination electrodes 1010 disposed on the rear surface facing circuit board 460. Electroluminescent region 710 can require intimate contact between electrodes 1010 and the electroluminescent (e.g., phosphor) layer 730. This contact can be accomplished by bonding circuit board 1060 to board 460 in a manner similar to touch sensitive display fabrication. One or more connectors similar to 315 can connect circuit boards 260,460 and 1060. A connector can also be used to connect circuit boards (e.g. 260 or 460) to another circuit board positioned behind the X-Y plane formed by the flange 206 of the speaker 205. Electrodes on boards 260, 460 and 1060 can also be connected using wires and solder contacts.

The interactive speaker grille 1005 enables a large area of the speaker grille 214 to be functionalized as a control surface and a display surface. In one aspect the speaker grille 214 can be made from an electrically insulating material, thereby enabling the interactive speaker grille to identify user interaction with multiple distinct regions of the grille. A dense plurality of openings 120 can facilitate effect sound transmission. Interactive speaker grille 1005 can devote a large region (e.g. region 240*d*) to speaker controls. As wireless speakers have become more compact the surface area devoted to user controls has decreased. In contrast interactive speaker grille 1005 could devote the whole grille area to controls such as radio station selection, play, pause or skip to the next song. The touch sensitive capability and the illumination functionality can be combined to implement an interactive control. For example many of the speakers on the market do not have enough available area to provide a volume slider and therefore require the user to press a volume button multiple times to increment or decrement volume. This repeated button pushing is tedious and the user is often left without a visual indication of the volume level. Illumination components 330 and low voltage output signals 322*c* can instead produce a visual pattern of illuminated sections 130*c* on the interactive speaker grille that effectively indicate the present volume level. A user can use a corresponding touch sensitive region (e.g. 240*c* or 240*d*) to initiate volume change. Touch functionality and illuminated components can be implemented on circuit boards with a dense plurality of openings arranged so as to enable sound impedance of the interactive speaker grille 1005 in FIG. 10 is determined primarily by the sound impedance of the grille member 214.

In another embodiment electrical switch assembly 100 can be used to replace the functionality of a mechanical object (e.g., mechanical toggle switch) with which a user associates a characteristic sound (e.g., the "click" sound associated with a light switch or the chime associated with a doorbell). A speaker 205 disposed behind the touch sensitive speaker grille can produce the sound familiar to the user. This embodiment has the advantage that the user receives the sound from the area that is touches (i.e. the speaker grille) and not from another area away from the touch sensitive surface, which would have the potential to confuse a user. For example the electrical switch assembly 100 could produce a familiar click sound when a user touches an area of the grille operable to control an electrical switch. In another example the touch sensitive speaker grille could be used to guide a person towards a touch sensitive surface with audio feedback. For example a person with visual impairment could follow sound emanating from the touch sensitive speaker grille in order find the touch sensitive surface operable to control aspects of the speaker or electrical switches. The sound could vary to indicate that the user if getting closer or further from the interactive speaker grille.

Operation—FIGS. 12-15

Figure 12:
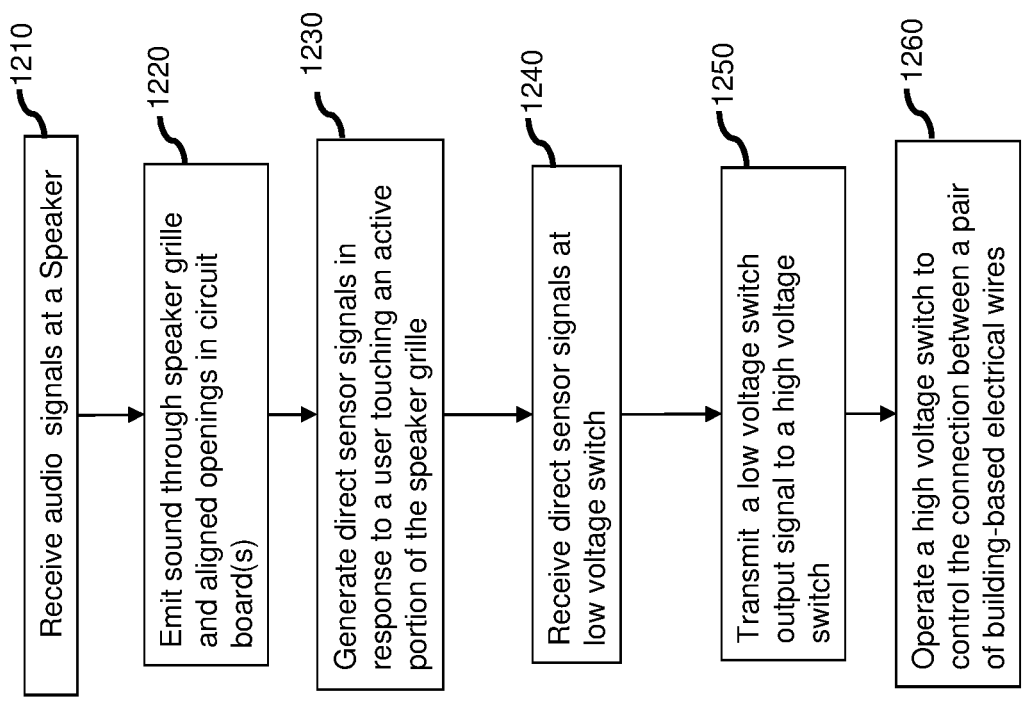
FIG. 12 is a flow chart diagram that outlines the operation of an electrical switch assembly with audio capability in accordance with an aspect of the present disclosure.

FIG. 12 is a block diagram illustrating the operation an electrical switch assembly with audio capability in accordance with one embodiment of the present technology. At block 1210 the speaker 205 receives audio signals 316 from amplifier 309. At block 1220 speaker 205 emits sound waves through a pattern of openings in the speaker grille 214 and an aligned pattern of openings in one or more circuit boards (e.g., openings 220 in circuit board 260). At block 1230 a user touches a region of the speaker grille portion 214 of the faceplate 105, wherein the region is operable to be sensed by electrodes on circuit board 260 or functionalized surface 910 disposed behind the front surface of the faceplate. At block 1230 electrodes (e.g. 255, 605*a* and 605*b*) generate direct sensor signals 311*a*. At block 1240 sensor signals 311*a* are received by one or more low voltage switches 320. At block 1240 the low voltage switch processes the signals; determine if the signals meet specific criteria (e.g. touch location, duration, sequence). At block 1250 electrical switch assembly 100 generates one or more low voltage switch output signals 322 and transmits these signals to one or more high voltage switches (e.g. dimmer 323*a* connected to wires 110*a* and 110*c* or relay 323*b* in FIG. 3). At block 1260 one or more high voltage switches (e.g. 323*a*) operate to control the connection between one or more pairs building-based electrical wires. This operating sequence enables the functionality of a traditional electrical switch to be replicated using a combination of a low voltage switch and a high voltage switch, while devoting the space traditionally occupied by the mechanical switch to a large speaker centrally disposed in the switch housing and operable to project sound waves through a touch sensitive speaker grille.

Figure 13:
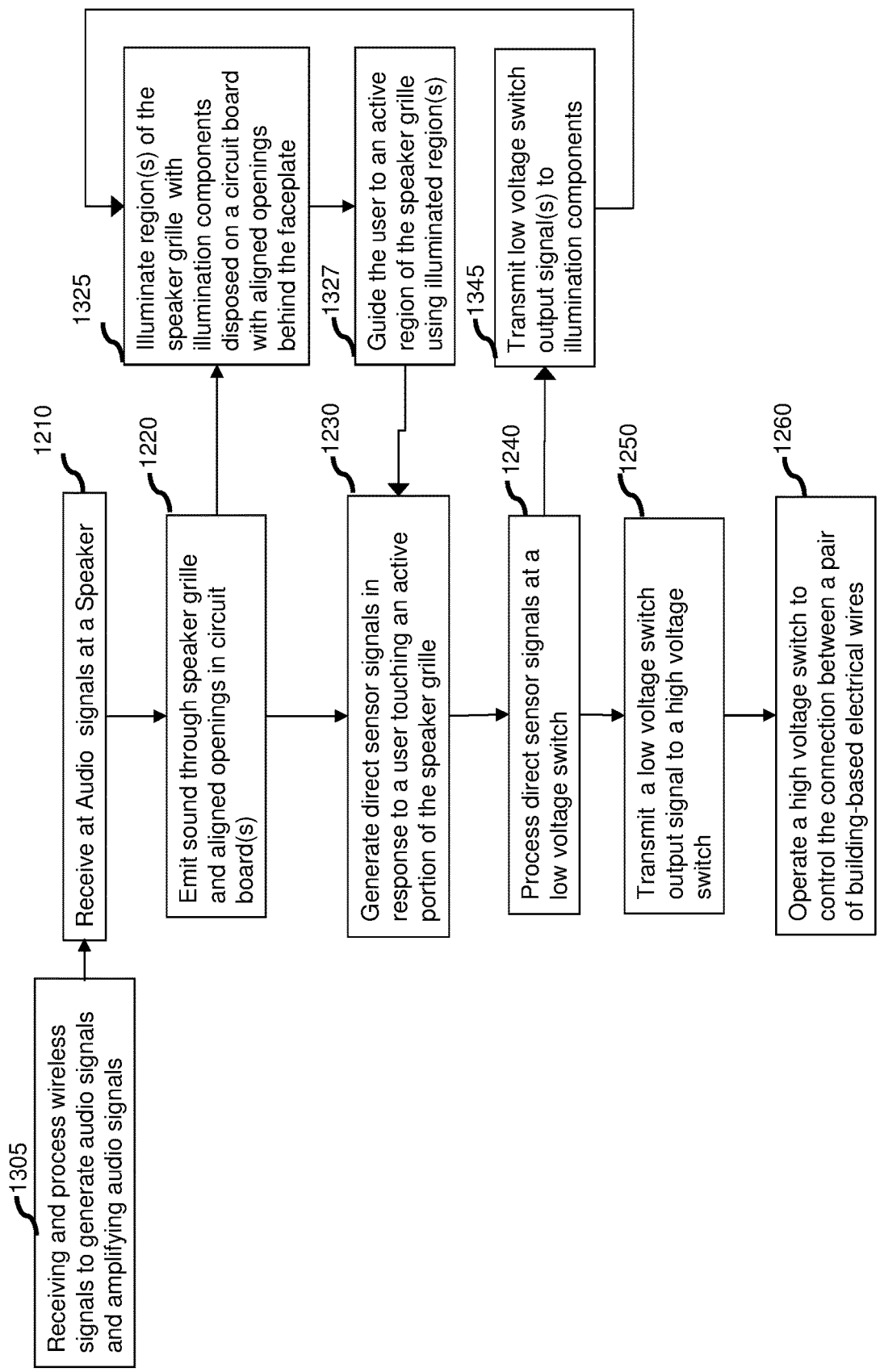
FIG. 13 is a flow chart diagram that outlines the operation of an electrical switch assembly with audio capability and illuminated switch indication in accordance with an aspect of the present disclosure.

FIG. 13 is a block diagram illustrating additional steps involved in the operation of some alternative embodiments of the electrical switch assembly.

At block 1305 electrical switch assembly can receive wireless signals 135 from a variety of wireless sources 140. System 100 can use a wireless receiver 306, speaker processor 308 and amplifier 309 to generate audio signals 316. At block 1325 electrical switch assembly 100 can illuminate regions of the speaker grille using illumination components 330 disposed on a circuit board designed with a plurality of aligned openings, wherein the opening promote sound transmission. At block 1327 electrical switch assembly 100 can optionally guide the user to an active region of the speaker grille using one or more illuminated regions 130. At block 1345 illumination components 330 can be controlled using low voltage switch output signals 322*d* from the low voltage switch processor 320.

Figure 14:
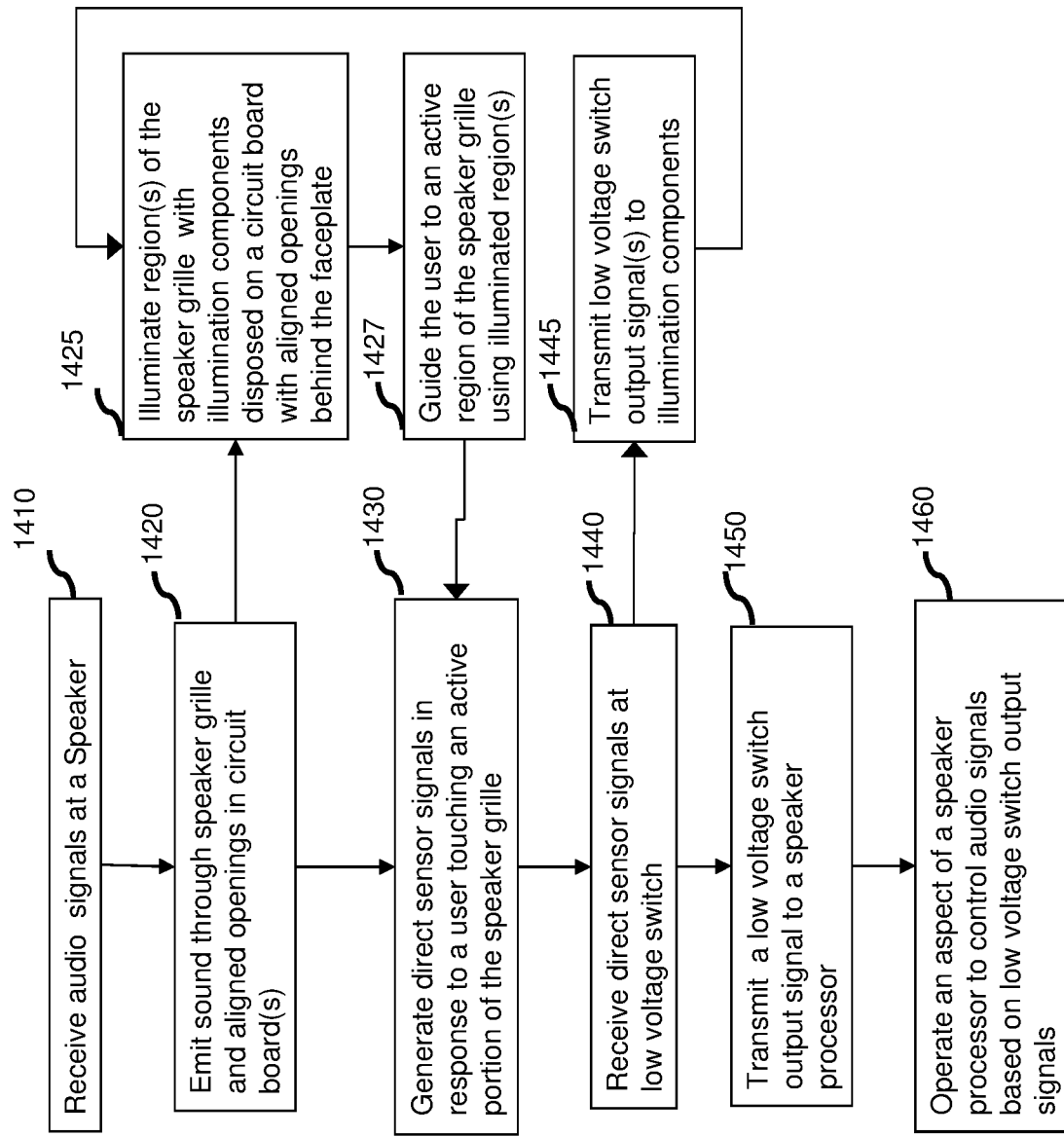
FIG. 14 is a flow chart diagram that outlines the operation of an interactive speaker grille with audio capability and illuminated grille regions in accordance with an aspect of the present disclosure.

FIG. 14 is a block diagram illustrating the operation an interactive speaker grille 1005 in accordance with one embodiment of the present technology. At block 1410 the speaker 205 receives audio signals 316 from amplifier 309. At block 1420 speaker 205 emits sound waves through a plurality of openings in the speaker grille 214 and an aligned plurality of openings in one or more circuit boards (e.g., openings 220 in circuit board 260). At block 1425 interactive speaker grille 1005 can illuminate regions of the speaker grille using illumination components 330 disposed on a circuit board designed with a plurality of aligned openings, wherein the openings promote sound transmission. At block 1430 a user touches a region of the speaker grille 214, wherein the region is operable to be sensed by direct user input sensors 310 (e.g. sensor electrode 255) on circuit board 260 or functionalized surface 910 disposed behind the front surface of the faceplate. At block 1427 interactive speaker grille 1005 can optionally guide the user to an active region of the speaker grille using one or more illuminated regions 130. At block 1430 electrodes (e.g. 255, 605a and 605b) generate direct sensor signals 311a. At block 1440 sensor signals 311a are received by one or more low voltage switches 320. At block 1440 the low voltage switch processes the signals; determine if the signals meet specific criteria (e.g. touch location, duration, sequence). At block 1445 illumination components 330 can be controlled using low voltage switch output signals 322d from the low voltage switch processor 320. At block 1450 a low voltage switch 320 generates one or more low voltage switch output signals 322c and transmits these signals to a speaker processor 308. At bock 1460 speaker processor 308 controls an aspect of audio signals 316 sent to speaker 205.

FIG. 15 is a block diagram outlining the operations associated with integrating audio capability into an electrical switch assembly 100 in accordance with several aspect of the present disclosure. At block 1510 the integration can involve providing a housing 210 including a forward facing portion 217. At block 1520 the integration can involve providing a speaker 205 disposed inside the housing. At block 1530 the integration can involve providing a faceplate operable to be attached to the housing and to cover the speaker. At block 1540 the integration can involve providing a grille portion of the faceplate having a first plurality of openings for sound generated by the speaker to be transmitted to the region in front of the assembly. At block 1550 the integration can involve providing one or more sensors disposed behind the forward facing surface of the faceplate and operable to sense direct user interaction with one or more regions of the forward facing surface of the faceplate. At block 1560 the integration can involve incorporating a second plurality of openings into the sensor substrate. At block 1570 the integration can involve aligning at least one of the openings in the first and second plurality, so as to promote improved sound transmission through the sensor substrate. At block 1580 the integration can involve providing a low voltage switch operable to process direct sensor signals from one or more of the sensors. At block 1590 the integration can involve providing sensor placement such that one or more of the sensors are operable to sense direct user interaction with the grille portion of the faceplate.

Smart Speakers

Recent advancements in building automation and multimedia (e.g. streaming video and audio) are inspiring media companies to extend wireless speakers to become bi-directional interfaces to smart building and the World Wide Web. Voice-activated wireless speakers enable a variety of new uses including controlling local building automation devices, appliances, issuing web-requests and accessing remote audio and music content. Many of these new uses rely on automatic speech recognition (ASR) and are enabled by arrays of microphones and voice-recognition algorithms to steer a high gain region or lobe (e.g. beamforming) towards a person speaking in a room. Direct input sensors (e.g. buttons and touch sensitive regions) are common in most wireless speakers. A parallel area of development in smart speakers is the use of indirect input sensors to sense voice commands, gestures, room-layout, person location, person identity and the presence of other smart devices in the local environment (e.g. in the same room or in the same building). Exemplary indirect input sensors can include microphones, antenna arrays, LIDAR or gesture recognizing RADAR and cameras. Exemplary indirect input sensors can use a variety of technologies to sense the local environment including light detection, thermal detection, passive infrared detection, active infrared, ultrasound, sound and capacitive coupling.

Figure 16A:
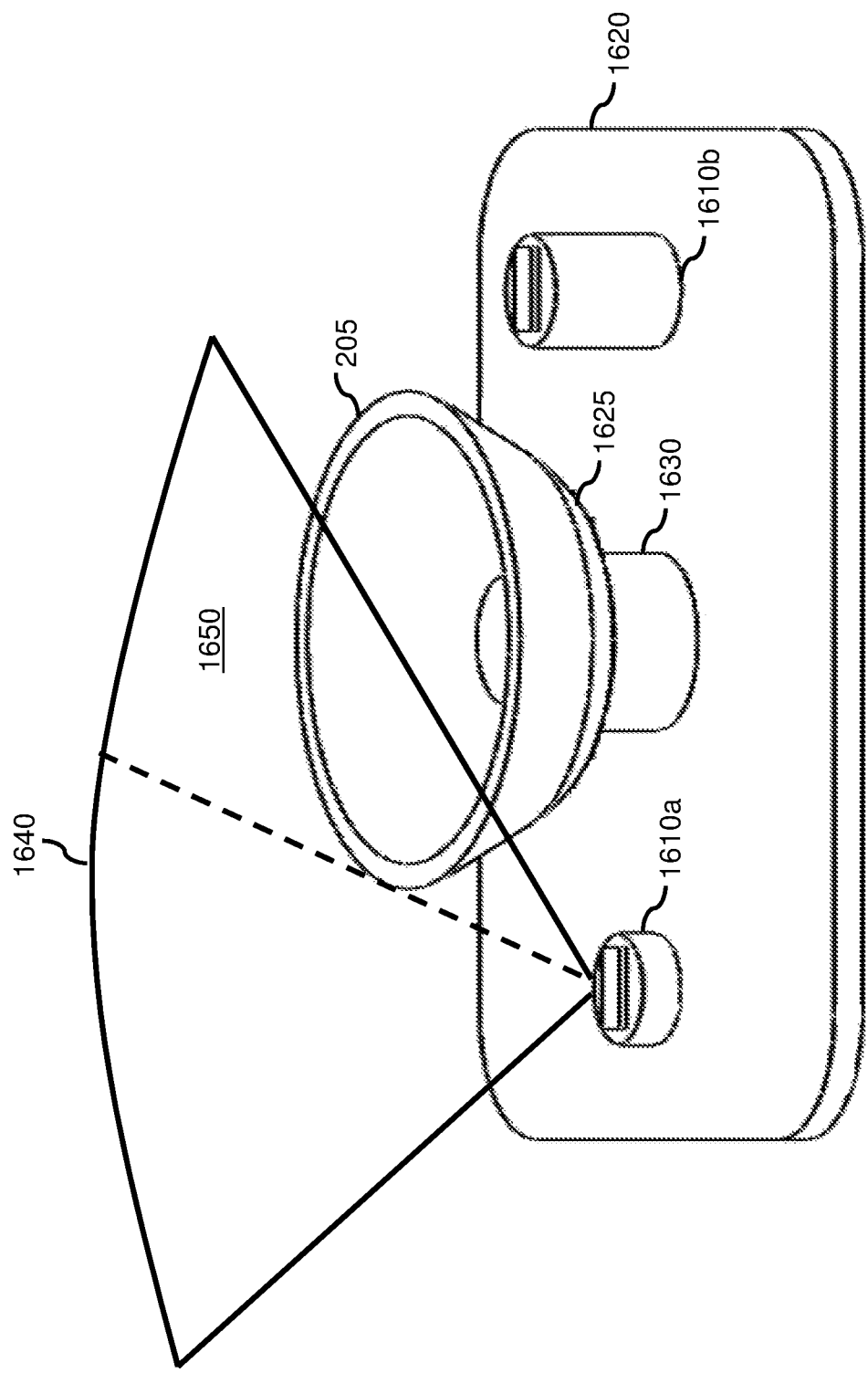
FIG. 16A illustrates a traditional arrangement of a speaker and a plurality of indirect input sensors.

One challenge is that indirect input sensors compete for space with speaker elements in smart wireless speakers. The size of the speaker element (e.g. the speaker cone and driver) can impede the performance of indirect input sensors. For example, in FIG. 16A a speaker 205 and two indirect input sensors 1610a and 1610b (e.g. a motion sensor) are located on a common substrate 1620. Speaker 205 comprises a speaker cone 1625 and speaker driver 1630 (e.g. an electromagnet). Indirect input sensor 16010a has a total field of view 1640 comprising the set of all angles for which sensor 1610a can transduce indirect input into indirect input sensor signals (e.g. 311b in FIG. 3). Speaker 205 obstructs a large portion (e.g. portion 1650) of the total field of view 1640. Indirect input sensor 1610b can augment the field of view 1640 but nevertheless the presence of speaker 205 considerably complicates sensing aspects of the local environment. In the case of FIG. 16A placing the indirect input sensors 1610a and 1610b behind the plane of the front of the speaker cone (i.e. out of the path of sound transmission) can improve sound quality but can impede sensor performance.

Figure 16B:
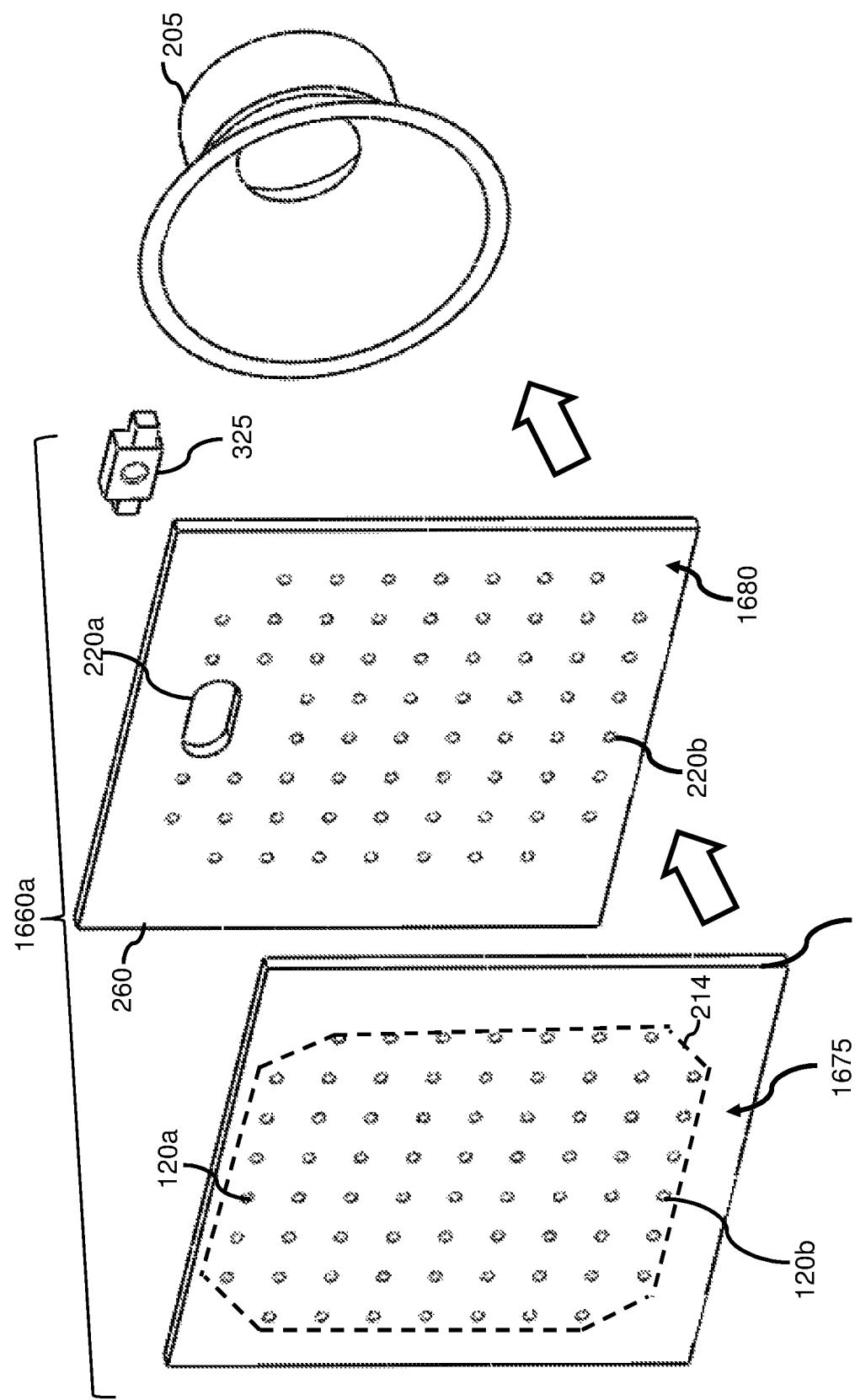
FIGS. 16B and 16C illustrate a speaker and an environmental sensing faceplate subassembly, in accordance with several embodiments of the present disclosure.

FIG. 16B is a disassembled diagram of an alternative solution including an environmental-sensing faceplate subassembly 1660a placed in the sound transmission path (e.g. in front) of speaker 205. In the embodiment of FIG. 16B environmental-sensing faceplate subassembly 1660a includes faceplate 1605 with a front surface 1675. A portion 214 of surface 1675 contains a first plurality of openings forming a speaker grille. Environmental-sensing faceplate subassembly further comprises an indirect input sensor 325 and a circuit board 260. Circuit board 260 can be a flat circuit board with an insulating substrate, a flexible printed circuit board, a molded 2-D or 3-D polymer substrate with attached conductive elements or plated conductive elements or a ceramic printed circuit board. Faceplate 1605 can be a portion of the outer housing or enclosure of a speaker assembly. Faceplate 1605 can be similar in design and function to faceplate 105. Circuit board 260 comprises a second plurality of openings in a second surface 1680. Several opening in the grille portion 214 of the front surface 1675 can align with corresponding openings in the circuit board (e.g. 120b can align with 220b in surface 1680) and thereby promote sound transmission from speaker 205. Other openings in grille portion 214 of front surface 1675 (e.g. 120a) can align with one or more openings in circuit board 260 (e.g. opening 220a in surface 1680) and thereby enable indirect input sensor 325 to sense an aspect of the local environment.

In several embodiments an environmental-sensing faceplate subassembly comprises: an front surface with a first plurality of openings forming a grille, a circuit board places in the path of sound transmission from a speaker and an indirect input sensor, wherein the circuit board comprises means that enable the indirect input sensor to sense an aspect of the environment in the vicinity of the smart speaker and wherein the circuit board has a surface with openings that align with the grille to promote improved sound transmission from the speaker.

In another embodiment an environmental-sensing faceplate subassembly comprises: a front surface, contains a first plurality of openings forming a speaker grille, an indirect input sensor disposed on a second surface behind the front surface with a second plurality of openings, and wherein at least one of the openings in the first and second plurality of openings are aligned, thereby promoting improved sound transmission from the speaker. For example the second surface can be the rear surface of faceplate 1605 or the housing of a speaker. The rear surface of faceplate 1605 can be functionalized with conductors and mounting pads for one or more indirect input sensors using the plating techniques and molding techniques simpler to the faceplate in FIG. 9. In this way one embodiment of the environmental-sensing faceplate substrate can be a faceplate portion of a housing with a plurality of openings extending through a first and second surface on the faceplate such that opening in the first and second surfaces align in the direction of sound transmission. An indirect input sensor can be attached to the faceplate and can be encompassed by at least some of the plurality of openings.

Figure 16C:
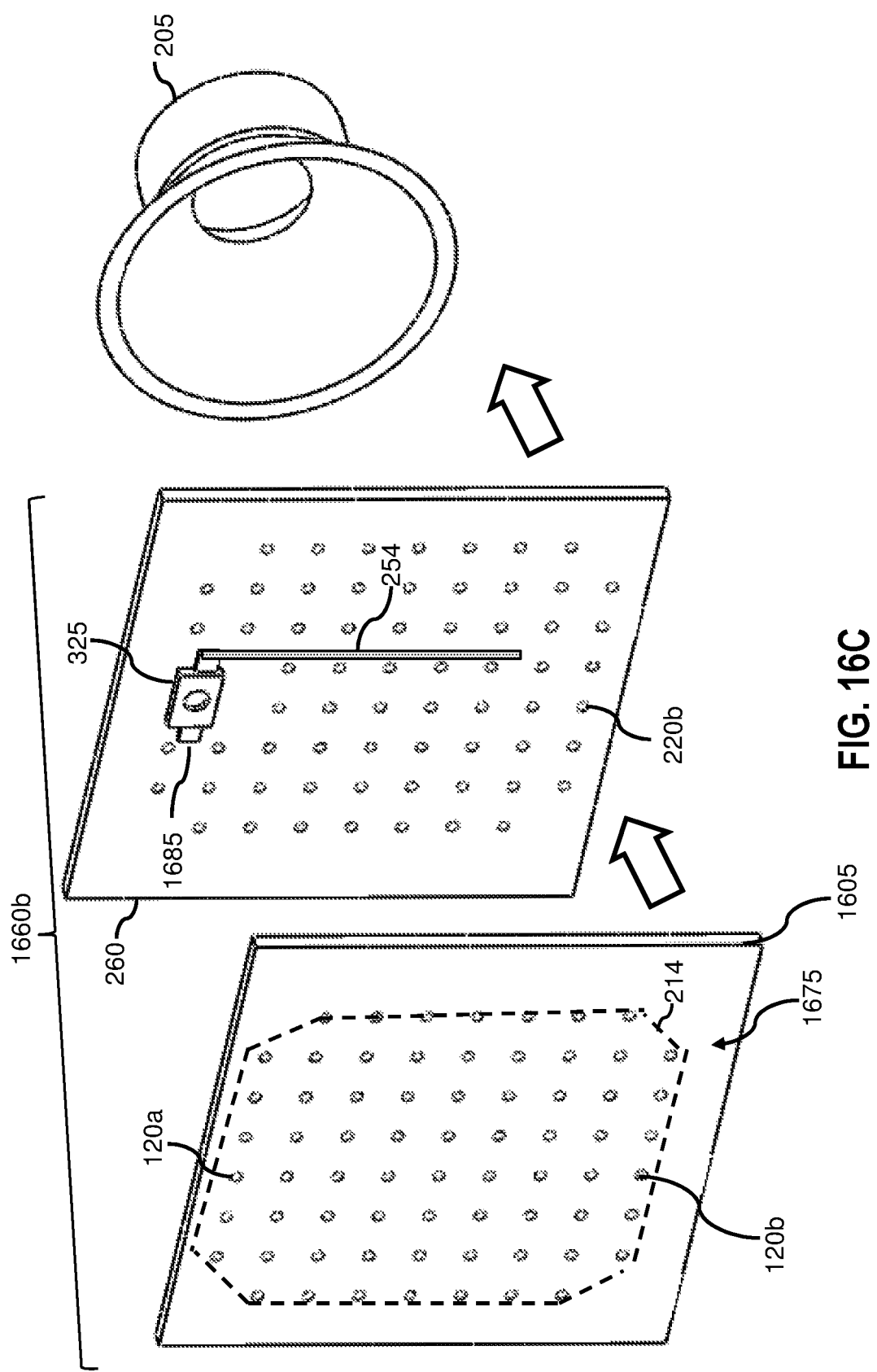

FIG. 16C illustrates an alternative environmental-sensing faceplate assembly 1660*b* in which indirect input sensor 325 is located on circuit board 260. Exemplary means by which circuit board 260 can enable indirect input sensor 325 (e.g. a light level sensor) to sense the local environment can include: one or more openings (e.g. 220*a* in FIG. 16B) to facilitate access to the local environment, a mounting surface for indirect input sensor 325 or one or more electrical connectors (e.g. bond pads 1685) on circuit board 260 to transport electrical signals associated with indirect input sensor 325 or conductors (e.g. 254) to carry power to indirect input sensor 325 or carry sensor signals from indirect input sensor 325.

In some embodiments of the environmental-sensing faceplate subassembly the indirect input sensor can sense through the material of the faceplate. For example the faceplate 1605 can be made from a material that is transparent to the sensing technology, such as an optically transparent material or an RF transparent polymer. In other embodiments of the environmental-sensing faceplate subassembly the faceplate portion of the housing can be opaque or non-transmitting to the sensing technology. In such embodiments the environmental-sensing faceplate subassembly enables the indirect input sensor (e.g. 325) to be aligned with one or more openings (e.g. 120*a*) in the exterior surface of the faceplate (e.g. 120*a* aligning with sensor 325 in FIG. 16C).

Figure 17:
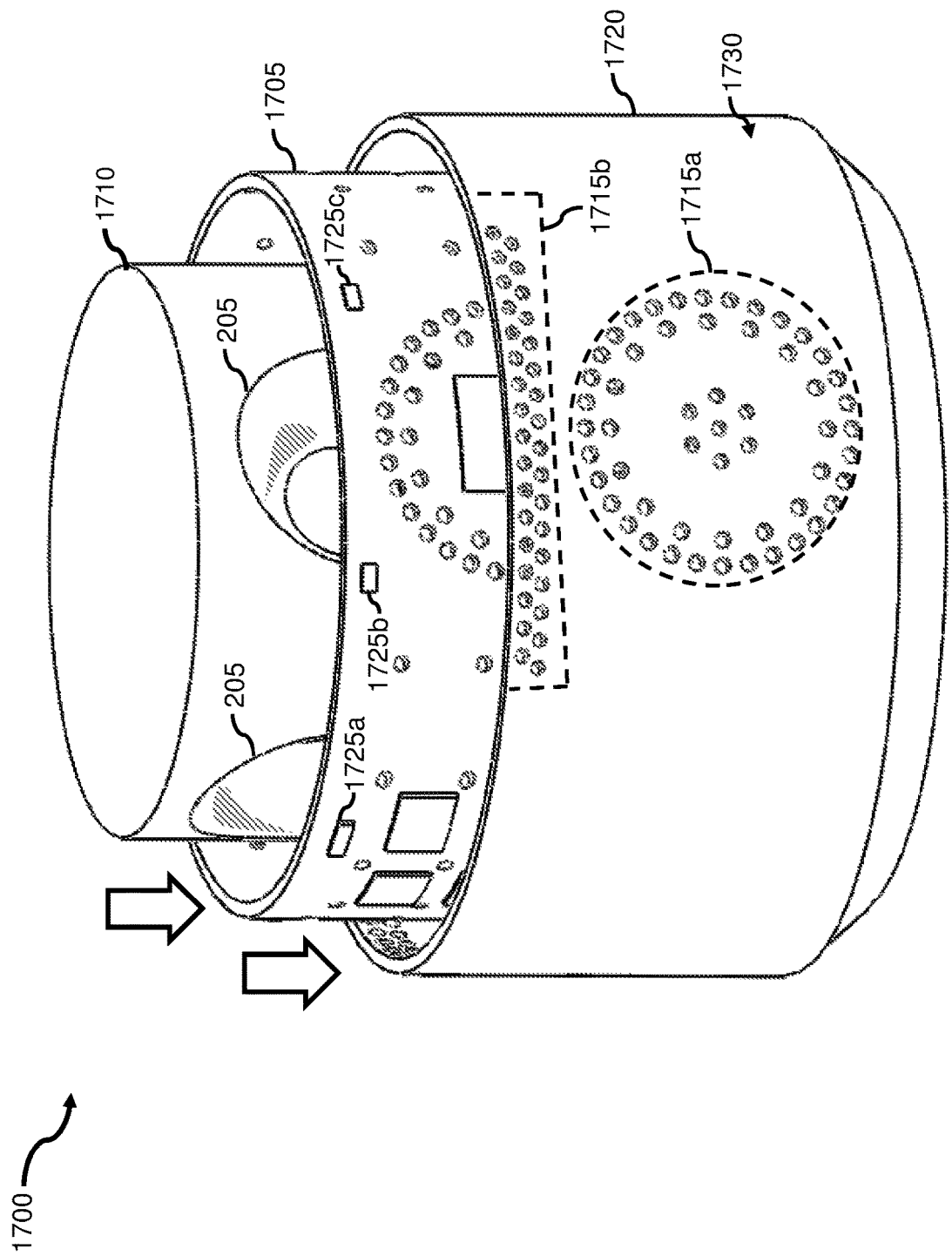
FIG. 17 illustrates a smart speaker according to an embodiment of the present disclosure.

Turning to FIG. 17, a smart speaker 1700 can include a circuit board (e.g. curved circuit board 1705) in the path of sound transmission from a speaker assembly 1710. The combination of an array of openings and indirect input sensors on circuit board 1705 provides multiple uses for the space behind the large portion of the speaker housing 1720 often devoted to the speaker grille. The external surface 1730 of housing 1720 contains a first plurality of openings forming a speaker grille. The openings can be grouped to form several portions (e.g. 1715*a* and 1715*b*). Various groups of openings in the plurality of openings can accomplish a variety of different purposes. For examples, a subset of the opening in the grille can accomplish an aesthetic purpose (e.g. defining a shape with the pattern of openings) while another subset of the plurality of openings can serve a functional purpose (e.g. enabling environmental access for different sensors and speakers). In FIG. 17 a portion 1715*a* of the speaker grille has openings designed to align with openings in circuit board 1705 and thereby promote sound transmission from speakers 205. A second portion 1715*b* of the speaker grille provides improved access for indirect input sensors 1725*a*, 1725*b* and 1725*c* to the local environment (e.g. the region in front of surface 1730).

Figure 18:
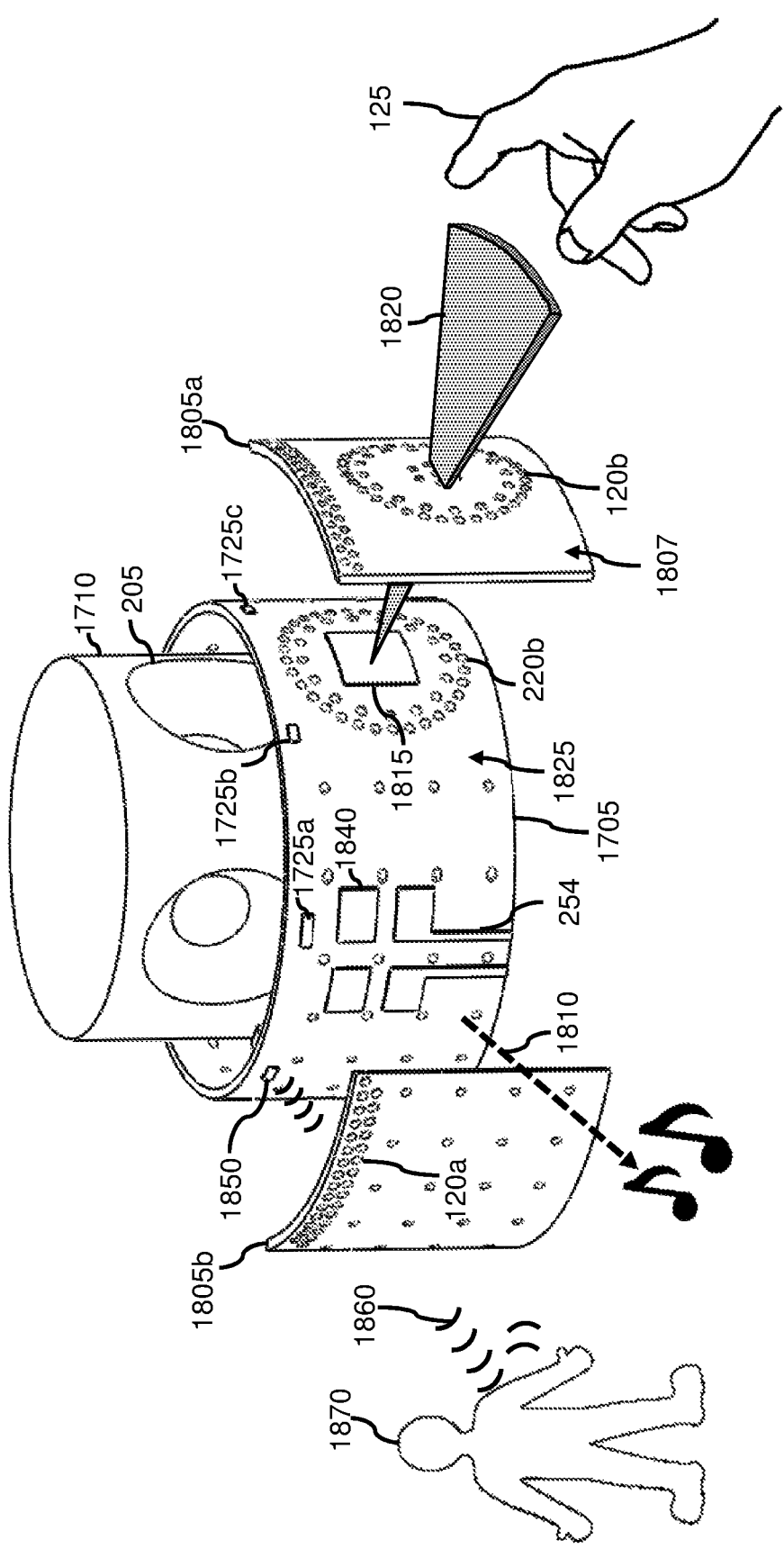
FIG. 18 illustrates a disassembled view of a smart speaker including a plurality of indirect input sensors located on a circuit board in accordance with an embodiment of the present disclosure.

FIG. 18 illustrates a disassembled view of smart speaker 1700 including two grille portions 1805*a* and 1805*b* of housing 1720. In the assembled position several first opening (e.g. opening 120*b*) in the grille portions of the housing align with second openings (e.g. 220*b*) in the circuit board 1705 and thereby promote sound transmission illustrates by path 1810. The first openings can be in the front (or exterior) surface 1807 of the grille portion 1805*a* of housing 1720 and can align with second openings in a surface 1825 of circuit board 1705. Circuit board 1705 contains a variety of indirect input sensors (e.g. 1815 encompassed by a plurality of openings, the sensor array comprising 1725*a*, 1725*b*, 1725*c*, patterned metallic feature 1840, and 1850). Indirect input sensor 1815 can be radar, or LIDAR operable to transmit an energy beam 1820 into the local environment and characterize the placement of objects based on the one or more aspects of reflections from the energy beam 1820 (e.g. time-of-flight, amplitude, phase, dispersion, waveform shape or distortion of the reflections from beam 1820).

Gesture Recognition

One or more indirect input sensors (e.g. 1815) can recognize gestures made by a user and thereby control aspects of the smart speaker 1700. For example, indirect input sensor 1815 can be the Soli 76 Ghz radar system-on-chip available from Infineon Inc. or Milpitas Calif. and can identify hand gestures made by a user 125. If the radar were placed in a traditional location away from the path of sound transmission it could experience a large radar reflection from the speaker. In the FIG. 18 placement of the radar chip on circuit board 1705 in front of speaker 205 enables improved access to the local environment. In addition the portion of the housing 1805*a* in front of indirect input sensor 1815 can be modified with openings or an RF transparent polymer to promote radar transmission. Due to the close placement to the housing 1720 only a small portion of housing 1720 need be modified to enhance the entire field of view of the indirect input sensor 1815. Indirect input sensor 1815 can also be lidar operable to scan a laser beam through the grille or optically transparent portion of housing 1720. One or more indirect input sensors (e.g. 1815) can be an LED or laser based lidar that performs ranging or gesture recognition based on illuminating some or all of the local environment with visible or infrared light.

Circuit board 1705 can contain one or more conductors 254. Patterned conductors can form one or more antennas (e.g. patch antenna 1840). The placement of circuit board 1705 between the sound generating elements and the grille enables an array of antennas (e.g. 1840) to characterize the direction of incoming RF signals or the relative strength of incoming RF signals from different directions. A plurality of antennas can be placed in the path of sound transmission and utilize more space thereby improving the antenna gain. Indirect input sensor 1850 can be an active ultrasound sensor and can utilize a portion of the grille e.g. opening 120*a* to transmit a signal 1860 into the local environment and sense or characterize the location of people (e.g. 1870) or objects. Indirect input sensors 1725*a*, 1725*b*, and 1725*c* can be a beamforming microphone array and utilize a portion of the speaker grille (e.g. portion 1715*b* in FIG. 17 to identify the direction of speech. In one embodiment indirect input sensors can be mounted on an interior surface of housing 1720 in FIG. 17. Housing 1720 can comprise the plurality of aligned openings on a first and second surface. In yet another embodiment one or more of the opening in the circuit board 1705 can form part of an indirect input sensor (e.g. part of an antenna) or can form part of a conductive path (e.g. a via hole for a conductor). For example one of the openings in the plurality of openings on the circuit board can be designed to both align with an opening in the grille and can be a plated hole thereby forming part of conductive pathway for current on the circuit board.

Figure 19A:
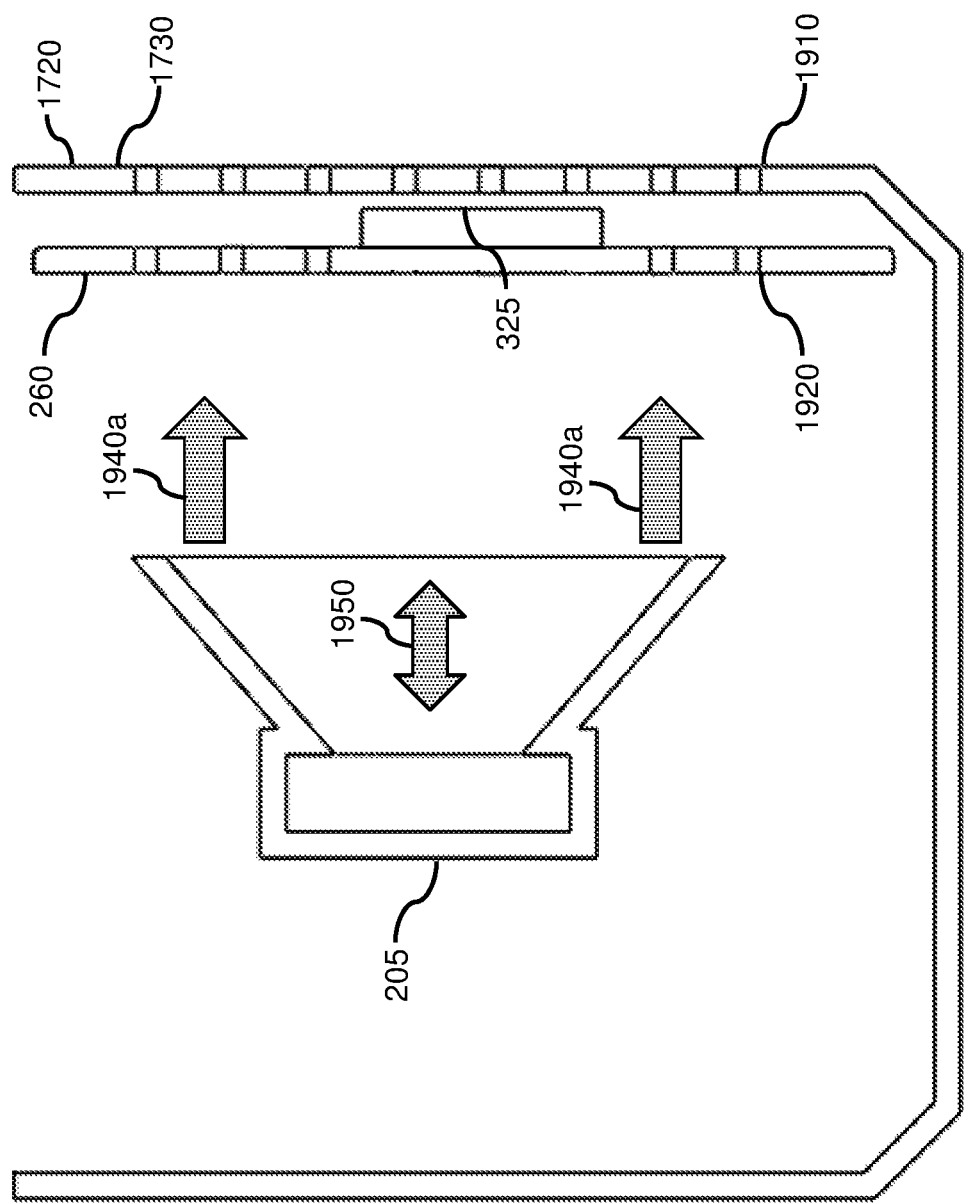
FIGS. 19A, 19B and 19C illustrate exemplary placement of a circuit board with an indirect input sensor, wherein the circuit board is placed in the path of sound transmission from a speaker to the region in front of the speaker grille, in accordance with several embodiments of the present disclosure.

FIG. 19A illustrates an embodiment wherein a circuit board 260 with an indirect input sensor 325 is in the path of sound transmission 1940*a* between a speaker 205 to the front surface 1730 of housing 1720. In the embodiment of FIG. 19A speaker 205 generates sound by vibrating in directions 1950 while circuit board 260 is perpendicular to the directions of vibration of the speaker and perpendicular to the direction of sound transmission 1940*a*. Several openings in housing 1720 align with openings in circuit board 260 (e.g. openings 1910 and 1920) such that the combined sound impedance of the aligned openings when viewed along the direction of sound transmission is substantially equal to the sound impedance of the grille openings alone. In the embodiment of FIG. 19A speaker 205 generates sound by vibrating in direction 1950 while circuit board 260 is perpendicular to the direction of vibration of the speaker and perpendicular to the direction of sound transmission 1940*a*.

Figure 19C:
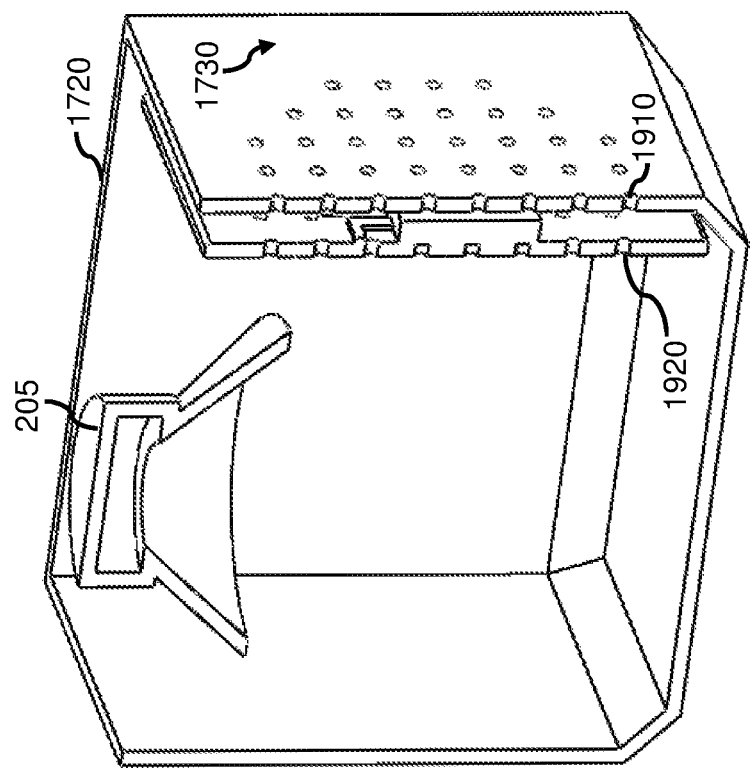
Figure 19B:
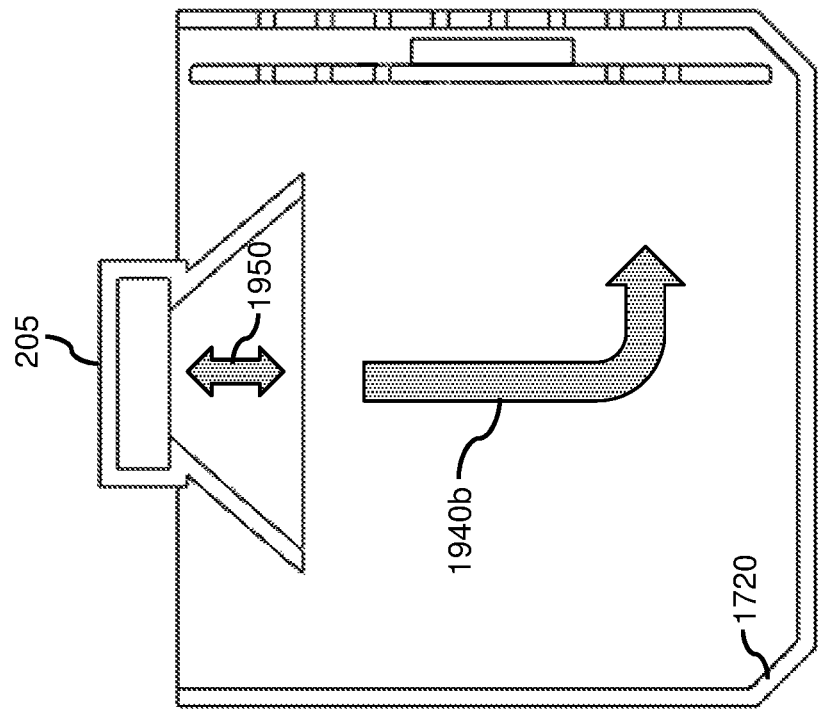

FIG. 19B and FIG. 19C illustrate another embodiment, that is common with bass speakers wherein the path of sound transmission undergoes a direction change between generation in direction 1950 and passing through the grille. Nevertheless, circuit board 260 with an indirect input sensor 325 is in the path of sound transmission 1940*b* from speaker 205 to the front surface 1730 of housing 1720.

Figure 20:
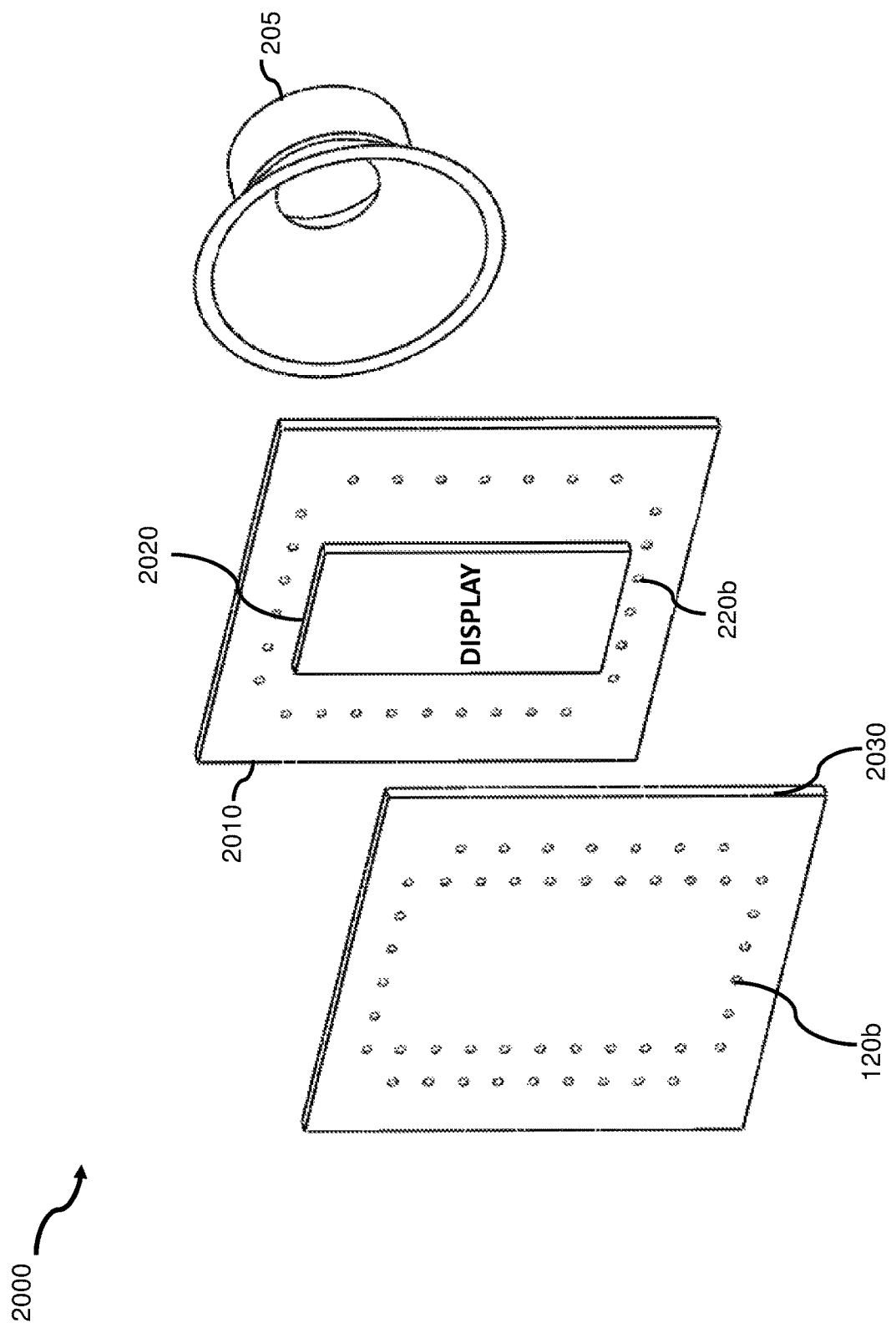
FIG. 20 illustrates a display on a circuit board in the path of sound transmission from a speaker to a region in front of a speaker grille, in accordance with an embodiment of the present disclosure.

FIG. 20 illustrates a related embodiment in which a circuit board 2010 with plurality of openings is positions in the sound transmission path (e.g. in front of the cone) of a speaker 205. The plurality of openings in the circuit substrate can encompass a display 2020 (e.g. an LCD or an organic LED display). The circuit board is positioned behind a faceplate 2030 that contains a first plurality of openings. Some of the first plurality of openings (e.g. opening 120*b*) align with openings in the circuit board (e.g. opening 220*b*), thereby promoting sound transmission from the speaker 205. In a traditional display with speakers (e.g. a flat screen TV) the speakers can be mounted at the side of the display. The width of side-positioned speakers determines at least in part ability or effectiveness of the speaker to create low frequency sound waves (e.g. the ability to create deep bass sounds). In this way narrow speakers positioned on either side of the display often have a smaller frequency range than a larger speaker positioned behind the display (as illustrated in FIG. 20). Hence one advantage of arrangement 2000 is to enable lower base tones using a larger speaker positioned behind the display. Circuit board 2010 and in particular the aligned openings (e.g. 120*b* and 220*b*) in the circuit board and the faceplate enable transmission of the speaker sound while displaying images. One area of application for the embodiment of FIG. 20 is locations where the area for a display is limited while sufficient depth is available to mount the speaker behind the display. Exemplary applications include appliances (e.g. smart thermostats), smart routers and smart light switches where a large (e.g. 4×4 inch) speaker can be mounted behind a display in a 2-bay electrical junction box.

Figure 21:
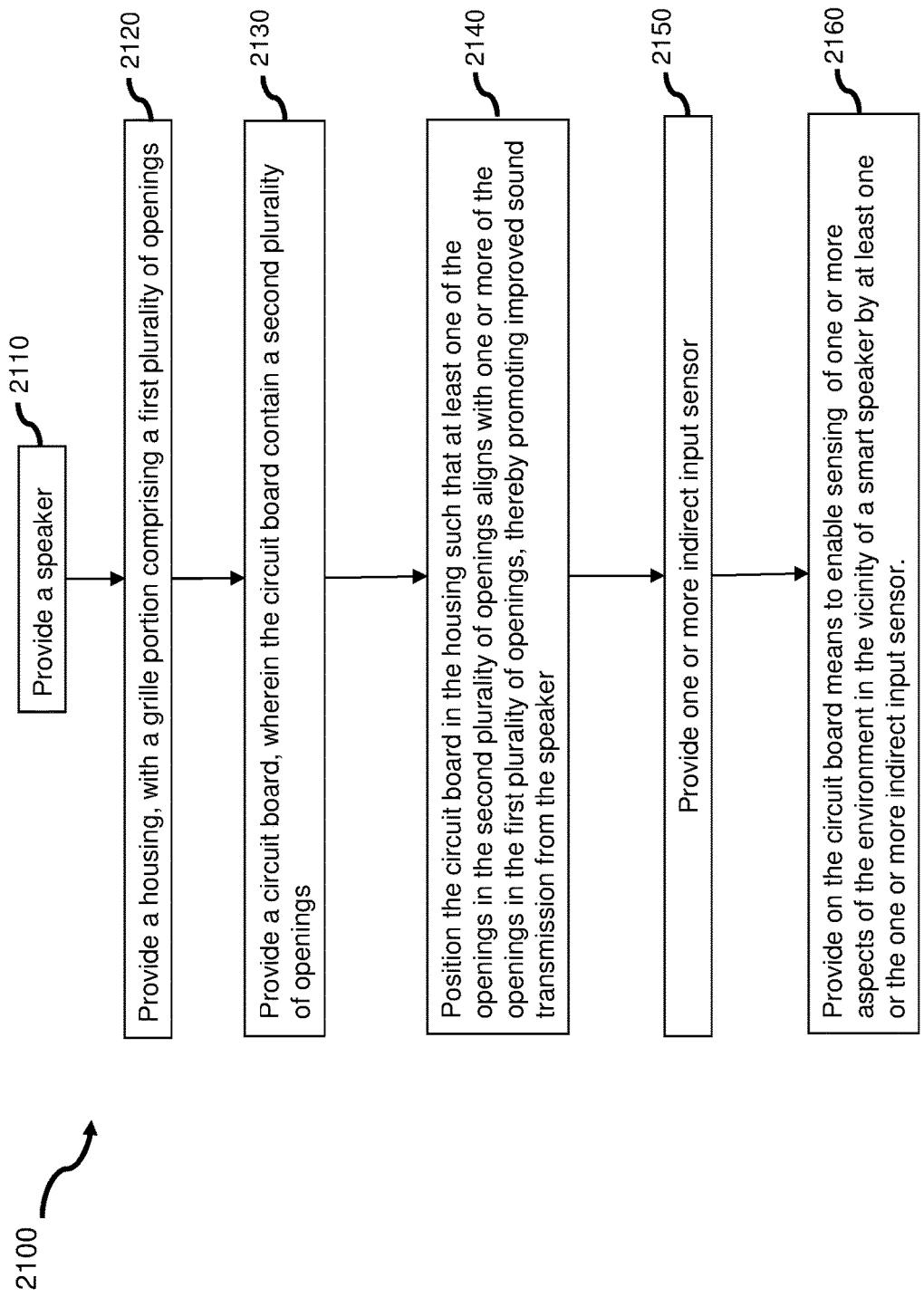
FIG. 21 is a flow diagram that outlines the operations associated with integrating environmental sensing into a smart speaker in accordance with an embodiment of the present disclosure.

FIG. 21 illustrates a method 2100 for integrating environmental sensing into a smart speaker. At step 2110 a speaker is provided. The speaker can be part of a speaker assembly such as speaker assembly 1710 in FIG. 17. At step 2120 a housing is provided. The housing can comprise several attached parts (e.g. two halves of a clamshell molded housing or a housing similar to 210 with a faceplate similar to 105 in FIG. 2). The housing is provided with a grille portion comprising a first plurality of openings. The grille portion can be a molded array of holes in a portion of the housing or a metal mesh component of the housing.

At step 2130 a circuit board is provided with a second plurality of openings. The circuit board can have at least one electronic component disposed on the circuit board. Exemplary electronic components that can be disposed on the circuit board include, an indirect input sensor, a wire, a conductive metallic trace, a resistor, a diode, a capacitor, a inductor, a microchip, a button or an LED. The at least one electronic component can be disposed on the circuit board by mechanically attaching it to the board (e.g. gluing, fastening or insert molding) or electronically connecting it to the circuit board (e.g. soldering, crimping or mating to a connector on the circuit board).

At step 2140 the circuit board is positioned in the housing such that at least one of the openings in the second plurality of openings aligns with one or more of the openings in the first plurality of openings, thereby promoting improved sound transmission from the speaker. The positioning at step 2140 can involve placing the circuit board within the housing, in the path of sound transmission.

At step 2150 one or more indirect input sensors are provided. At step 2160 means are provided on the circuit board to enable sensing of one or more aspects of the environment in the vicinity of a smart speaker by at least one or the one or more indirect input sensor. Exemplary means include electrical bond pads to attach the indirect input sensor on the circuit board or mechanical attachment (e.g. fastening) features on the circuit board to mechanically connect the direct input sensor to the circuit board. Other means on the circuit board to enabling sensing by the indirect input sensor include one or more opening in the circuit board to enable the indirect input sensor to sense the region beyond the grille, wires or conductors disposed on the circuit board to provide power to the indirect input sensor or carry indirect input sensor signals from the indirect input sensor. Other means on the circuit board include conductors or components that act to gather or condition an input signal from the environment (e.g. antenna elements for a radar chip or a filter network, such as a frequency selective band-pass filter disposed on the circuit board).

FIG. 22 illustrates a sound generating system 2200 with an interactive speaker grille. In several embodiments the interactive speaker grille enables user controls to be disposed on the grille portion of an interactive faceplate subassembly, thereby combining the functions of sound transmission and sound system control into the speaker grille. Embodiments provide circuitry operable to control a plurality of functions of the sound system by sensing direct user interaction with distinct regions of the speaker grille.

In a simple embodiment a sound generating system comprises a housing 2215 and a speaker 205 located at least partially inside the housing. The sound generating system can further comprises a speaker grille 214, comprising a plurality of openings (e.g. openings 120a and 120b) and a plurality of regions on the speaker grille (e.g. regions 240a-c), each comprising some of the plurality of openings. The sound generating system can further comprises circuitry 2210 coupled to the speaker grille 214, configured such that in response to direct user interaction with one of the regions on the speaker grille, the circuitry generates one or more corresponding electrical signals, indicative of the region of the speaker grille experiencing direct user interaction.

In several embodiments, circuitry 2210 is configured to identify direct user interaction with any one or more of a plurality of regions of the speaker grille 214 and to generate one or more electrical signals indicative of the region experiencing direct user interaction. For example, faceplate 2235 can contain a speaker grille 214 comprising a plurality of openings. The speaker grille can comprise a plurality of region such as region 240a with markings indicating a PAUSE user function or control region 240b of the speaker grille with markings indicating a VOLUME user function or control or region 240c with markings indicating an ON user function or control. The circuitry can be configured to, in response to direct user interaction with any of the plurality of regions, generate one or more electrical signals indicating the region touched. Hence a large portion of the faceplate, devoted to the speaker grille, can be further used to provide a plurality of distinct user controls. For example, in response to touching the volume region 240b of grille 214 the circuitry can generate one or more electrical signals that indicate to the speaker 205 to change the volume. The one or more electrical signals can be direct sensor signals 311a (e.g. small electrical sensor signals generated when a user touches a capacitive touch screen) or can be low voltage switch output signals 322c-e (e.g. processed electrical signals based in part on direct sensor signals). The one or more electrical signals can indicate the corresponding region of the speaker grille in a variety of manners, such as location or placement of the electrical signals within a parallel bundle of signal wires indicating one or more electrodes associated with a region and associated with particular wires in a bundle are experiencing direct user interaction. Similarly, a serial wire bus (e.g. an SPI or USB bus) can generate one or more electrical signals whose pattern is indicative of direct user interaction with a corresponding region of the speaker grille. The one or more electrical signals indicative of direct user interaction with a region can further indicate aspect of the direct user interaction, such as touch duration, swipe direction, touch pressure, simultaneously touched regions, touch sequence, start, end and intermediate locations within the region.

In one aspect, the circuitry can be further configured to, in response to direct user interaction with the at least one of the plurality of regions of the speaker grille control at least one aspect of signals to the speaker or function of the sound generating system using the corresponding electrical signals. For example, in response to sensing direct user interaction with volume region 240b, circuitry 2210 (e.g. including a touch sensing circuit outside the path of sound transmission and touch electrodes 255 and 605b in the path of sound transmission) can generate electrical signals indicative of both the location in region 240b and the length of a users swipe (e.g. 2 inches within the region) and use the electrical signals to a degree of volume change of the sound generating system. Similarly the PAUSE region can be electrically coupled to the circuitry such that in response to direct user interaction with the PAUSE region 240a the circuitry generates electrical signals indicative of the user interaction in the PAUSE region. The signals indicative of interaction in the pause region can further cause sound or visual media (e.g. an internet sound stream or an MP3) playing on the sound generating system to pause.

Circuitry 2210 can comprise one or more direct user input sensors (e.g. 310 in FIG. 3) such as electrodes e.g. 255 or 605b, low voltage switches 320 such as a microcontroller, sensor data acquisition circuitry (e.g. a touch sensing circuit), a speaker codec or processor 308, a wireless receiver (e.g. 306 in FIG. 3), illumination components such as light emitting diodes 470, and a memory device 2230 such as a solid state memory chip or RAM or FLASH memory in a microchip.

The electrical signals can be indicative of the region experiencing direct user interaction and can control a variety of aspects of the sound generating system. Regions can control sound volume, media selection, media stop/start or sound equalization. In one example, a television or large appliance could have a plurality of smart speakers with interactive grilles and could provide customized tuning for each speaker, using embodiments of the disclosed system with interactive speaker grille.

In a related embodiment the circuitry can be configured to generate, in response to direct user interaction with a region form the plurality of regions of the speaker grille, a corresponding set of electrical signals that function to control illuminate components that illuminate the corresponding region of the speaker grille. In some embodiments the circuitry is configured to generated corresponding signals that control distinct illumination of only the region from the plurality of regions that is touched. For example, a grille may have 6 regions each operable to control a different function when touched and the electrical signals corresponding to each region can cause illumination components to illuminate only that region, or to illuminate that region with greater intensity or a different color than other regions, thereby providing visual feedback of the regions touched.

In one advantage the disclosed system functionalizes a large surface of the speaker grille. Specific regions can have associated functions indicated with molded or painted visual indicating features such as writing or symbols (e.g. indicating PLAY, PAUSE, VOLUME control functions). Each of a plurality of regions can have features (e.g. symbols, writing, graphics, molded patterns, raised or lowered portions of the grille, delineated regions boundaries) that visually indicate a corresponding function of the sound generating system. Direct user interaction with indicated regions can cause the circuitry to control or perform the corresponding function (e.g. volume or sound input source) of the speaker. For example, a boundary of at least one of the regions can be illustrated on the speaker grille and a symbol within the region can indicate an associate user control or function operable to be controlled or performed by direction user interaction within the region of the grille.

Regions on the speaker grille can be non-overlapping such that no locations in either region belong to the other region, adjoining meaning that the regions touch one another. Regions can be non-overlapping and non-adjoining such that there is a buffer region on the speaker grille between the regions.

In several embodiments the speaker grille comprises a first plurality of openings e.g. 120a in a front surface of the sound generating system; the circuitry comprises a plurality of direct user input sensors located on a second surface behind the front surface, the second surface comprises a second plurality of openings and wherein at least one of the first plurality of openings aligns with at least one of the openings in the second plurality of openings, thereby promoting sound transmission through the second surface.

In a related embodiment a sound generating system can comprise an interactive faceplate subassembly 2205, comprising a front surface with a portion of the front surface containing a plurality of openings forming a speaker grille. The sound generating system can further comprise circuitry at least some of which is coupled to sense direct user interaction with the speaker grille. The circuitry is configured to generate upon sensing direct user interaction with a location on the speaker grille, one or more electrical signals indicative of the location on the speaker grille. Hence, the location experiencing direct user interaction can function as a region from a plurality of regions, operable to cause the circuitry to generate one or more electrical signals indicative of the location. In one aspect, the electrical signals can control illumination components to illuminate a region of the front surface of the interactive faceplate encompassing the location, in response to direct user interaction with the location.

In one exemplary embodiment the sound generating device can be a smartphone. The speaker grille can be the portion of the smartphone housing encompassing a first plurality of openings in the path of sound transmission from a speaker element located behind the speaker grille. The grille can have two regions each encompassing some of the openings. The regions can be adjoining and mutually exclusive or overlapping. The smartphone can further comprise first circuitry (e.g. touch sensitive electrodes) disposed behind the speaker grille operable to sense direct user interaction with each of the regions. The smartphone can further comprise second circuitry out of the path of sound transmission that detects direct sensor signals from the first circuitry, detects when a particular region experiences direct user interaction and generates corresponding electrical signals indicative of the region. In one example a small speaker grille comprising a 1 inch wide array of openings can be an interactive speaker grille to control the smartphone volume. The grille can be divided into a number (e.g. two or more) of regions along the width of the speaker grille. The first and second circuitry (collectively the circuitry) can sense the order or sequence in which the regions of the speaker grille experience direct user interaction and thereby sense the direction a user is swiping a finger (e.g. from right-to-left or from left-to-right. For example, the circuitry can increase the smartphone volume in response to a left-to-right swipe and decrease the volume for a right-to-left swipe.

While the above description contains many specificities, these should not be construed as limitations on the scope of any embodiment, but as exemplifications of various embodiments thereof. Many other ramifications and variations are possible within the teachings of the various embodiments. Thus the scope should be determined by the appended claims and their legal equivalents, and not by the examples given.

Any of the methods (including user interfaces) described herein may be implemented as software, hardware or firmware, and may be described as a non-transitory computer-readable storage medium storing a set of instructions capable of being executed by a processor (e.g., computer, tablet, smartphone, etc.), that when executed by the processor causes the processor to control perform any of the steps, including but not limited to: displaying, communicating with the user, analyzing, modifying parameters (including timing, frequency, intensity, etc.), determining, alerting, or the like.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Terminology used herein is for the purpose of describing particular embodiments only and is not intended to be limiting of the invention. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

Throughout this specification and the claims which follow, unless the context requires otherwise, the word "comprise", and variations such as "comprises" and "comprising" means various components can be co-jointly employed in the methods and articles (e.g., compositions and apparatuses including device and methods). For example, the term "comprising" will be understood to imply the inclusion of any stated elements or steps but not the exclusion of any other elements or steps.

In general, any of the apparatuses and methods described herein should be understood to be inclusive, but all or a sub-set of the components and/or steps may alternatively be exclusive, and may be expressed as "consisting of" or alternatively "consisting essentially of" the various components, steps, sub-components or sub-steps.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical values given herein should also be understood to include about or approximately that value, unless the context indicates otherwise. For example, if the value "10" is disclosed, then "about 10" is also disclosed. Any numerical range recited herein is intended to include all sub-ranges subsumed therein. It is also understood that when a value is disclosed that "less than or equal to" the value, "greater than or equal to the value" and possible ranges between values are also disclosed, as appropriately understood by the skilled artisan. For example, if the value "X" is disclosed the "less than or equal to X" as well as "greater than or equal to X" (e.g., where X is a numerical value) is also disclosed. It is also understood that the throughout the application, data is provided in a number of different formats, and that this data, represents endpoints and starting points, and ranges for any combination of the data points. For example, if a particular data point "10" and a particular data point "15" are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

Although various illustrative embodiments are described above, any of a number of changes may be made to various embodiments without departing from the scope of the invention as described by the claims. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

The examples and illustrations included herein show, by way of illustration and not of limitation, specific embodiments in which the subject matter may be practiced. As mentioned, other embodiments may be utilized and derived there from, such that structural and logical substitutions and changes may be made without departing from the scope of this disclosure. Such embodiments of the inventive subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A sound generating system comprising:
    a housing;
    a speaker located at least partially inside the housing;
    a speaker grille comprising a first plurality of openings;
    a plurality of regions on the speaker grille, each comprising some of the first plurality of openings; and
    circuitry coupled to the speaker grille, the circuitry being configured to generate, for each of the plurality of regions on the speaker grille, a corresponding one or more electrical signals indicative of the each of the plurality of regions, in response to direct user interaction with the each of the plurality of regions.

2. The sound generating system of claim 1 wherein for each of the plurality of regions the corresponding one or more electrical signals are direct sensor signals.

3. The sound generating system of claim 1 wherein at least some of the circuitry is operably coupled to the speaker; and wherein for at least one of the plurality of regions on the speaker grille, the circuitry is further configured, in response to direct user interaction with the at least one of the plurality of regions on the speaker grille, to control at least one aspect of signals to the speaker using the corresponding one or more electrical signals.

4. The sound generating system of claim 1 wherein at least some of the circuitry is operably coupled to the speaker and wherein the at least some of the circuitry is configured to, in response to direct user interaction with at least one of the plurality of regions, control at least one aspect of at least one signal to the speaker.

5. The sound generating system of claim 1 wherein the circuitry is configured to, for each of the plurality of regions on the speaker grille, control a corresponding function of the sound generating system, in response to direct user interaction with the each of the plurality of regions on the speaker grille.

6. The sound generating system of claim 1 wherein the circuitry is configured, in response to direct user interaction with each of the plurality of regions, to control a corresponding aspect of sound media from the sound generating system.

7. The sound generating system of claim 1 wherein the circuitry is further configured for each of the plurality of regions on the speaker grille to illuminate the each of the plurality of regions on the speaker grille, in response to direct user interaction with the each of the plurality of regions on the speaker grille.

8. The sound generating system of claim 1 wherein a boundary of at least one of the plurality of regions is visually indicated on the speaker grille.

9. The sound generating system of claim 1 wherein at least two of the plurality of region are mutually exclusive.

10. The sound generating system of claim 1 wherein two of the plurality of regions are non-overlapping; and
 wherein direct user interaction with each of the two of the plurality of regions on the speaker grille controls a distinct corresponding function of the sound generating system.

11. The sound generating system of claim 1 wherein the speaker grille further comprises a portion of a front surface of a faceplate and
 wherein the first plurality of openings are in the portion of the front surface of the faceplate.

12. The sound generating system of claim 1 wherein the circuitry comprises:
 a plurality of direct user input sensors located in a path of sound transmission from the speaker through the speaker grille; and
 one or more low voltage switches, located outside of the path of sound transmission between the speaker and the speaker grille, and configured to generate for the each of the plurality of regions, at least one low voltage sensor output signal indicative of the each of the plurality of regions, in response to direct user interaction with the each of the plurality of regions.

13. The sound generating system of claim 1 wherein the first plurality of openings are located on a first surface of the sound generating system;
 wherein the circuitry comprises a plurality of direct user input sensors located on a second surface located behind the first surface when viewed in a direction from the first surface to the speaker;
 wherein the second surface comprises a second plurality of openings; and
 wherein at least one of the first plurality of openings aligns with at least one of the openings in the second plurality of openings.

14. The sound generating system of claim 1 wherein for each of the plurality of regions the corresponding one or more electrical signals are distinct from the one or more electrical signals corresponding to all other regions in the plurality of regions, and function in response to the direct user interaction, to identify the each of the plurality of regions experiencing the direct user interaction.

15. The sound generating system of claim 1 wherein each of the plurality of regions on the speaker grille further comprises a corresponding visual indicator that indicates a function of the sound generating system; and
 wherein the circuitry is configured to perform the corresponding function of the sound generating system, upon direct user interaction with the each of the plurality of regions on the speaker grille.

16. A sound generating system comprising:
 a housing;
 a speaker located at least partially inside the housing;
 a speaker grille comprising:
  a plurality of openings, and
  a plurality of regions of the speaker grille, each region of the plurality of regions of the speaker grille comprising some of the plurality of openings; and
 circuitry coupled to the plurality of regions and configured to generate, in response to direct user interaction with any one or more of the plurality of regions, a corresponding low voltage sensor output signal indicative of the any one or more of the plurality of regions.

17. The sound generating system of claim 16 wherein the circuitry is further configured to control, in response to the direct user interaction with the any one or more of the plurality of regions a distinct function of the speaker corresponding to the any one of the plurality of regions, using the corresponding low voltage electrical output signal.

18. The sound generating system of claim 16 wherein the each of the plurality of regions of the speaker grille further comprise at least one feature that visually indicates a corresponding function of the speaker and wherein the circuitry is further configured to control, in response to direct user interaction with the any one or more of the plurality of regions the corresponding function of the speaker.

19. The sound generating system of claim 18 wherein for each of the plurality of regions of the speaker grille the corresponding functions of the speaker are mutually exclusive.

20. The sound generating system of claim 16 wherein the circuitry comprises a plurality of direct user input sensors operable to sense direct user interaction with the speaker grille;
 wherein a first non-zero subset of the plurality of direct user input sensors is operable to sense direct user interaction with a first region from the plurality of regions wherein a second non-zero subset of the direct user input sensors are operable to sense direct user interaction with a second region from the plurality of regions and wherein the first and second subsets of the plurality of direct user input sensors are mutually exclusive.

21. The sound generating system of claim 16 wherein the circuitry is operably coupled to the speaker and
 wherein the circuitry is configured, in response to direct user interaction with at least one of the plurality of regions, to control at least one aspect of at least one signal to the speaker.

22. A sound generating system comprising:
 a housing;
 a speaker located at least partially inside the housing; and
 an interactive faceplate subassembly comprising:
  a front surface, wherein a portion of the front surface contains a plurality of openings forming a speaker grille; and
  circuitry, wherein at least some of the circuitry is coupled to sense direct user interaction with the speaker grille;
  wherein the circuitry is configured to, upon sensing direct user interaction with a location on the speaker grille, generate one or more electrical signals indicative of the location on the speaker grille.

23. The sound generating system of claim 22 wherein the circuitry is operably coupled to the speaker and
 wherein the circuitry is configured, in response to the direct user interaction with the location to control at least one aspect of at least one signal to the speaker.

24. The sound generating system of claim 22 further comprising a first plurality of locations on the speaker grille, and
 wherein the circuitry is configured such that for each of the first plurality of locations on the speaker grille, direct user interaction with the each of the first plurality of locations causes the circuitry to generate a corresponding one or more electrical signals indicative of the each of the first plurality of locations.

25. The sound generating system of claim 22 further comprising one or more illumination components positioned behind the front surface of the interactive faceplate when viewed in a direction from the front surface to the speaker; and wherein the one or more electrical signals cause the illumination components to illuminate a region of the front surface of the interactive faceplate that encompasses the location.

26. The sound generating system of claim 22 wherein the circuitry comprises one or more direct user input sensors operable to sense direct user interaction with the front surface of the interactive faceplate;

wherein the one or more direct user input sensors are located on a rear surface located behind the front surface when viewed in a direction from the front surface to the speaker;

wherein the rear surface comprises a second plurality of openings; and wherein at least one of the openings in the second plurality of openings aligns with one or more of the openings in the first plurality of openings.

27. The sound generating system of claim 22 wherein the circuitry is operably coupled to the speaker and wherein the circuitry is configured, in response to direct user interaction with the location to control at least one aspect of at least one signal to the speaker.

\* \* \* \* \*